(12) United States Patent
Shepard et al.

(10) Patent No.: US 9,054,031 B2
(45) Date of Patent: Jun. 9, 2015

(54) EMBEDDED NON-VOLATILE MEMORY

(71) Applicants: Daniel R. Shepard, North Hampton, NH (US); Mac D. Apodaca, San Jose, CA (US); Thomas Michael Trent, Nashua, NH (US); James Juen Hsu, Saratoga, CA (US)

(72) Inventors: Daniel R. Shepard, North Hampton, NH (US); Mac D. Apodaca, San Jose, CA (US); Thomas Michael Trent, Nashua, NH (US); James Juen Hsu, Saratoga, CA (US)

(73) Assignee: CONTOUR SEMICONDUCTOR, INC., North Billerica, MA (US)

( * ) Notice: Subject to any disclaimer, the term of this patent is extended or adjusted under 35 U.S.C. 154(b) by 0 days.

(21) Appl. No.: 14/306,801

(22) Filed: Jun. 17, 2014

(65) Prior Publication Data

US 2014/0335669 A1   Nov. 13, 2014

Related U.S. Application Data

(63) Continuation of application No. 13/707,895, filed on Dec. 7, 2012, now Pat. No. 8,786,023.

(60) Provisional application No. 61/632,393, filed on Jan. 20, 2012, provisional application No. 61/630,297, filed on Dec. 8, 2011.

(51) Int. Cl.
| | |
|---|---|
| *H01L 27/24* | (2006.01) |
| *H01L 45/00* | (2006.01) |
| *H01L 21/8238* | (2006.01) |
| *H01L 27/04* | (2006.01) |
| *H01L 27/102* | (2006.01) |

(52) U.S. Cl.
CPC ............ *H01L 27/2436* (2013.01); *H01L 27/04* (2013.01); *H01L 21/8238* (2013.01); *H01L 45/06* (2013.01); *H01L 45/1683* (2013.01); *H01L 27/2409* (2013.01); *H01L 45/1233* (2013.01); *H01L 45/144* (2013.01); *H01L 27/2463* (2013.01); *H01L 27/1021* (2013.01)

(58) Field of Classification Search
USPC .................. 257/314–326, 330–370, E27.078, 257/E29.3–E29.309; 438/102, 199, 200
See application file for complete search history.

(56) References Cited

U.S. PATENT DOCUMENTS

| | | | |
|---|---|---|---|
| 2005/0223182 | A1 | 10/2005 | Zhang |
| 2009/0267045 | A1* | 10/2009 | Chang et al. ....................... 257/3 |
| 2010/0059731 | A1* | 3/2010 | Chang ............................... 257/3 |

* cited by examiner

*Primary Examiner* — Mamadou Diallo
(74) *Attorney, Agent, or Firm* — Morgan, Lewis & Bockius LLP

(57) ABSTRACT

The present invention is a method of incorporating a non-volatile memory into a CMOS process that requires four or fewer masks and limited additional processing steps. The present invention is an epi-silicon or poly-silicon process sequence that is introduced into a standard CMOS process (i) after the MOS transistors' gate oxide is formed and the gate poly-silicon is deposited (thereby protecting the delicate surface areas of the MOS transistors) and (ii) before the salicided contacts to those MOS transistors are formed (thereby performing any newly introduced steps having an elevated temperature, such as any epi-silicon or poly-silicon deposition for the formation of diodes, prior to the formation of that salicide). A $4F^2$ memory array is achieved with a diode matrix wherein the diodes are formed in the vertical orientation.

10 Claims, 39 Drawing Sheets

EMBEDDED NON-VOLATILE MEMORY

CROSS REFERENCE TO RELATED APPLICATIONS

This application is a continuation of U.S. patent application Ser. No. 13/707,895, filed on Dec. 7, 2012, which claims priority to and the benefit of U.S. Provisional Patent Application Ser. No. 61/630,297, filed on Dec. 8, 2011, and U.S. Provisional Patent Application Ser. No. 61/632,393, filed on Jan. 20, 2012, the entire disclosure of each of which is incorporated by reference herein.

FIELD OF THE INVENTION

The present invention relates to the manufacture and processing of semiconductors, and more particularly to the manufacture and processing of embedded memory on CMOS logic.

REFERENCE TO A SEQUENCE LISTING, A TABLE, OR A COMPUTER PROGRAM LISTING COMPACT DISK APPENDIX

Not Applicable.

REFERENCE REGARDING FEDERAL SPONSORSHIP

Not Applicable

STATEMENT REGARDING FEDERALLY SPONSORED RESEARCH OR DEVELOPMENT

Not Applicable.

SUMMARY OF THE INVENTION

Microcomputer chips and microcontroller chips typically have non-volatile memory for holding executable code and volatile memory for holding data and register values. More and more, microcontroller chips are providing small areas of non-volatile memory for holding key data values. For example, the application of a microcontroller would benefit if setup parameters could be stored in non-volatile memory along with executable code so that operation could resume after power is restored without having to reengage the setup process.

Presently, CMOS microcontroller chips incorporate small arrays of Flash memory for retention of key data values. Many CMOS microcontrollers also put executable code in Flash memory as well. However, in addition to CMOS' processing masks and processing steps, Flash memory requires several additional masks and their associated processing steps, whereby many of these additional masks are at the critical geometry of the overall process and therefore of the most costly class of mask. Furthermore, the additional processing steps for incorporating this non-volatile memory must not compromise the existing CMOS process nor significantly change that process. What is needed is a non-volatile memory that can be incorporated into a CMOS process that requires few additional masks and processing steps.

The present invention is a method of incorporating a non-volatile memory into a CMOS process that requires four or fewer masks and limited additional processing steps.

DESCRIPTION OF THE PREFERRED EMBODIMENT

Figure 1:
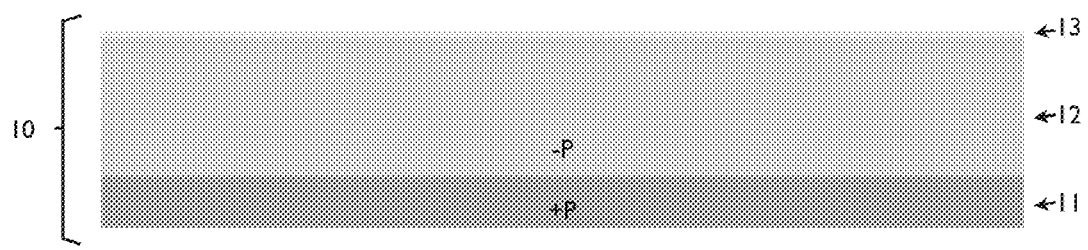
FIG. 1-76 are illustrations of a semiconductor substrate, following a sequence of processing steps, the result of each processing step being depicted in cross-section.

Today's CMOS processes are finely tuned, complex processes that are very sensitive to being broken if changes are made. On of the largest manufacturers of CMOS logic, the Intel Corporation, addresses this sensitivity with its slogan, "Copy exactly." In other words, even the slightest of changes can disrupt the entire process and require a re-tuning of that process. Various individual process steps and sequences are likewise very sensitive to being disrupted.

Some of the most delicate parts of the process include the silicon surface preparation of the areas of the substrate where the channels of MOS transistors are going to be put. These surfaces must be kept near perfect to avoid current leakage paths and recombination sites that would degrade performance.

Another sensitive stage is following the formation of salicided contacts to the MOS transistors as these contacts are easily damaged after formation by elevated temperatures (e.g., a temperature of 800° C. or higher).

The addition of a non-volatile memory array benefits if that array can be very compact. Typically, the most compact memory arrays have a $4F^2$ memory cell size. Typically a $4F^2$ memory array is achieved with a diode matrix wherein the diodes are formed in the vertical orientation. Furthermore, these diodes must have low leakage to prevent unnecessary power loss. Ideally, an epi-silicon diode formation process will yield the highest quality diodes. However, epi-silicon is grown at elevated temperatures.

Formation of one or more diode arrays within a CMOS process is problematic. If an array is formed after the CMOS process is completed, the thermal budget of the diode array processing will damage the salicided contacts of the MOS transistors. If a diode array is formed prior to the CMOS process, the delicate surface areas of the wafer where the MOS transistor channels are to be formed can be compromised. The present invention is a means of incorporating an epi-silicon (or poly-silicon), non-volatile diode memory array within a CMOS process without compromising the performance or characteristics of the resulting CMOS logic. The present invention is an epi-silicon process sequence that is introduced into a standard CMOS process (i) after the MOS transistors' gate oxide is formed and the gate poly-silicon is deposited (thereby protecting the delicate surface areas of the MOS transistors) and (ii) before the salicided contacts to those MOS transistors are formed (thereby performing any newly introduced steps having an elevated temperature, such as any epi-silicon or poly-silicon deposition for the formation of diodes, prior to the formation of that salicide). This timing of the diode formation steps has the additional advantage that the diode top contacts may also be provided with a salicided contact.

Referring to the figures, an entire CMOS process is outlined up to the metalization steps, with the steps of the present invention included therein. All of these steps are well understood by those skilled in the art of semiconductor manufacturing. Many of the steps outlined herein will have alternate approaches, process tools, chemistries, and the like for accomplishing the same result. The steps outlined herein as well as the Figures are an example of the preferred embodiment of the invention and have been presented for the purposes of illustration and description. They are not intended to limit the invention to the precise steps disclosed. The Figures are not in scale.

In FIG. 1, an initial substrate 10 is shown in cross-section. This substrate consists of a layer of P$^-$ epi-silicon 12 grown upon a P$^+$ silicon substrate 11. On this epi substrate is grown a very thin layer of thermal silicon dioxide 13. This oxide acts as a stress relief layer between the substrate and a subsequent nitride layer.

Figure 2:
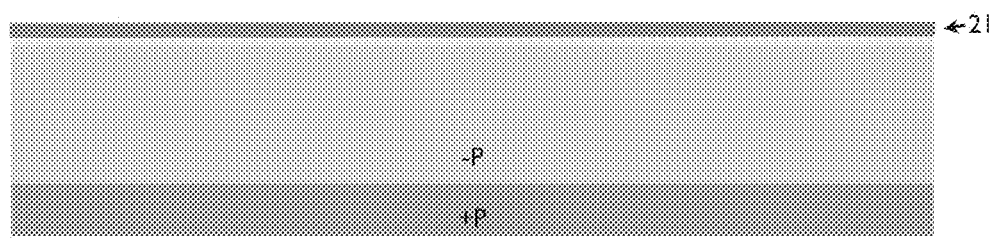

FIG. 2 shows the substrate in cross section following the deposition of Silicon Nitride (SiN$_x$) 21. This SiN$_x$ layer is deposited using Chemical Vapor Deposition (CVD). This layer serves as a polish stop layer during the formation of shallow trench isolation.

Figure 3:
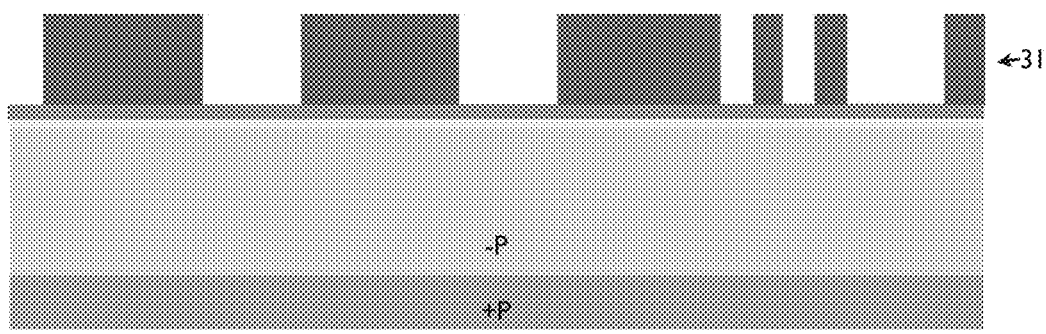

FIG. 3 shows the substrate in cross section following spin-on, exposure, and development of photoresist 31 for the definition of STI trenches. This is a critical mask and it incorporates the new features of the diode array bit-lines (which are a line-and-space pattern at the critical dimension), however the processing steps remain the same as a standard CMOS process without the inclusion of the present invention.

Figure 4:
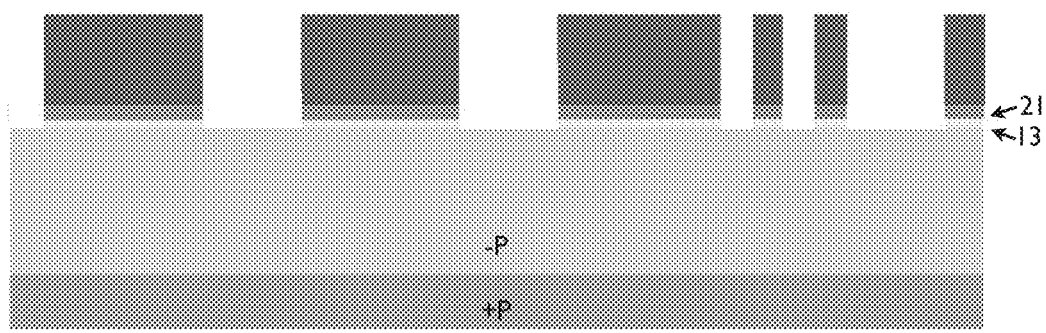

FIG. 4 shows the substrate in cross section following the etching of the SiN$_x$ 21 and Pad Oxide 13. A reactive ion etch (RIE) utilizing fluorine chemistry is used.

Figure 5:
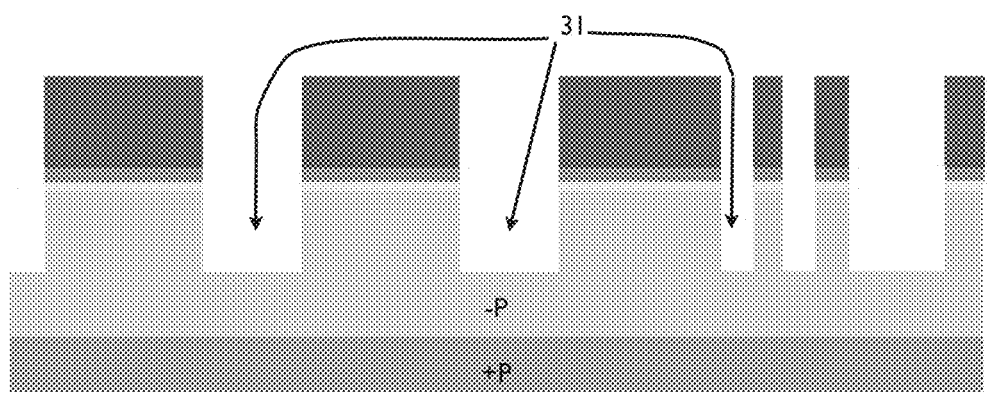

FIG. 5 shows the substrate in cross section following the etching of the STI trenches 31 into the silicon substrate. A reactive ion etch (RIE) utilizing fluorine chemistry is used. The STI defines the transistor active areas and the diode array bit-lines.

Figure 6:
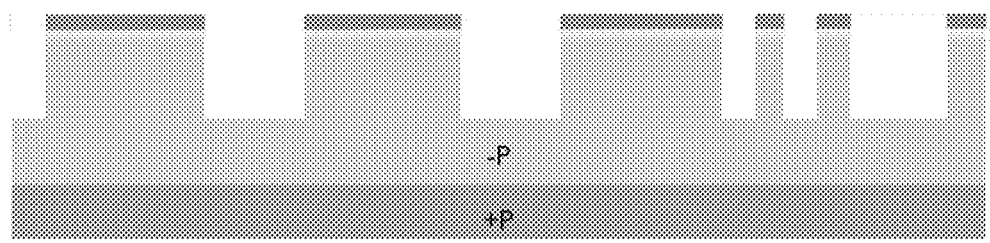

FIG. 6 shows the substrate in cross section following photoresist removal. An oxygen plasma is used to burn off any remaining photoresist.

Figure 7:
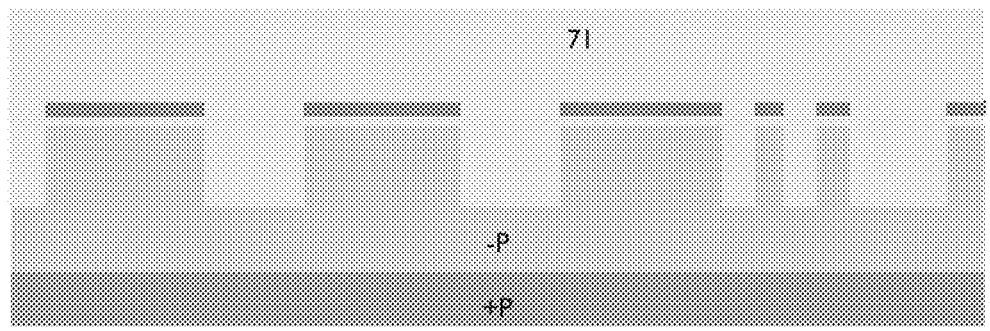

FIG. 7 shows the substrate in cross section following the filling of the STI trenches with oxide 71. This oxide layer is deposited using CVD to conformally fill the STI trenches. The oxide will electrically isolate the transistors in the circuit as well as the bit-lines.

Figure 8:
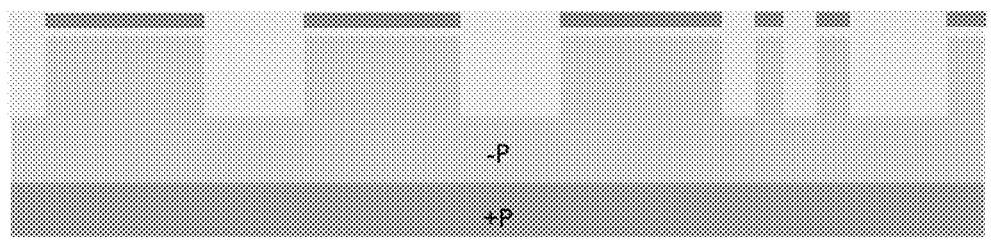

FIG. 8 shows the substrate in cross section following planarization of the STI trench oxide. The surface oxide is removed using Chemical Mechanical Polishing (CMP). The CMP process is formulated to stop (i.e., significantly slow down) when it hits silicon nitride.

Figure 9:
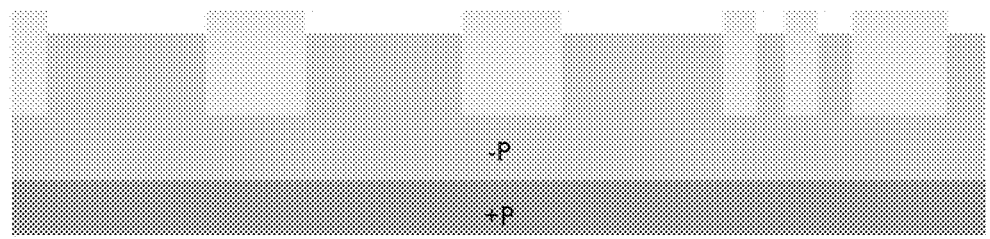

FIG. 9 shows the substrate in cross section following the removal of silicon nitride. A wet etch in hot phosphoric acid ($H_3PO_4$) is used to complete formation of the STI. An HF dip removes surface oxide.

Figure 10:
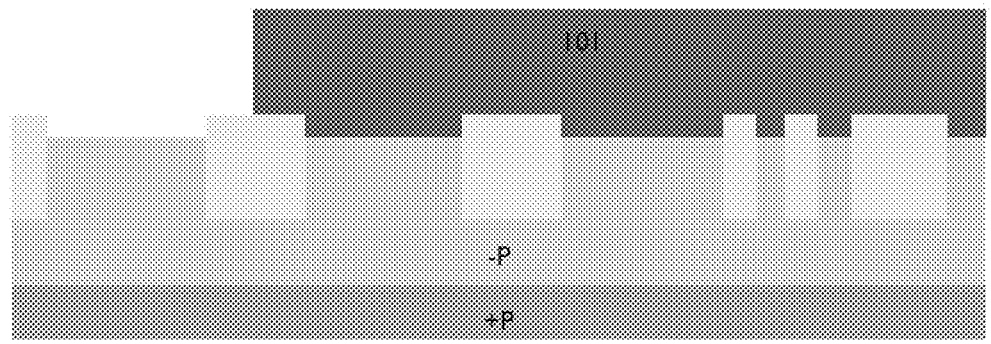

FIG. 10 shows the substrate in cross section following the spin-on, exposure, and development of photoresist 101 for N-well formation. This will help to form the PMOS transistors. The N-wells are patterned with a non-critical mask and thicker resist to block the subsequent implant.

Figure 11:
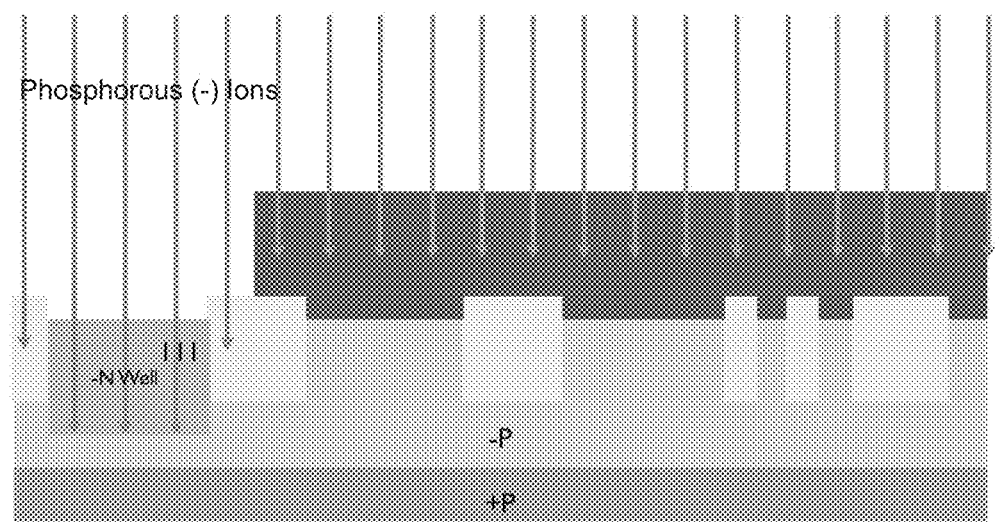

FIG. 11 shows the substrate in cross section during N-well implantation. A deep (high-energy) implant of phosphorous ions creates a localized N-type region 111 for the PMOS transistor.

Figure 12:
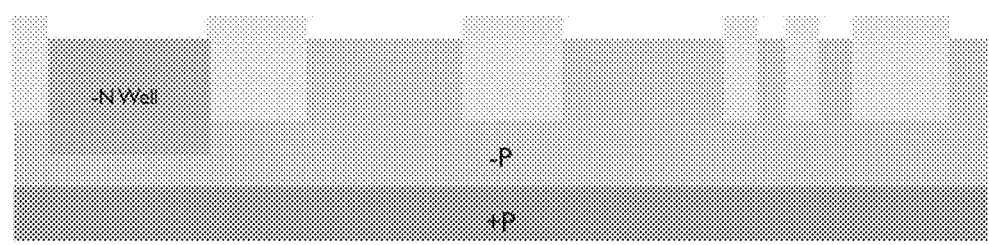

FIG. 12 shows the substrate in cross section following photoresist removal. An oxygen plasma is used to burn off any remaining photoresist.

Figure 13:
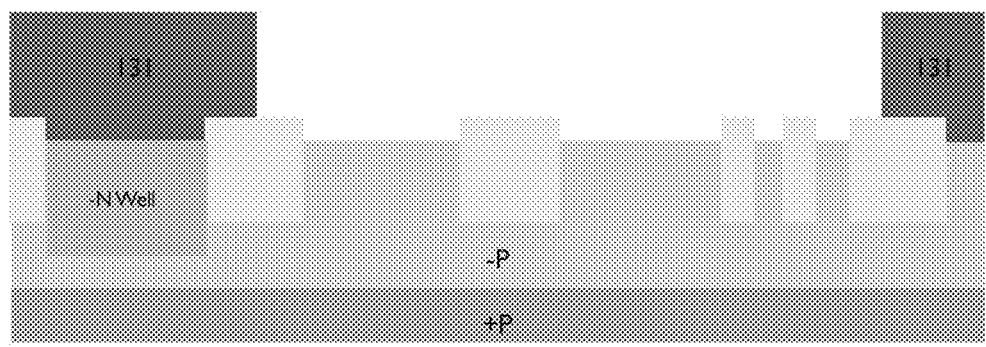

FIG. 13 shows the substrate in cross section following the spin-on, exposure, and development of photoresist 131 for P-well formation. This will help to form the NMOS transistors. The P-wells are patterned with a non-critical mask and thicker resist to block the subsequent implant. The P-well for the bit-lines will be doped in parallel with the NMOS.

Figure 14:
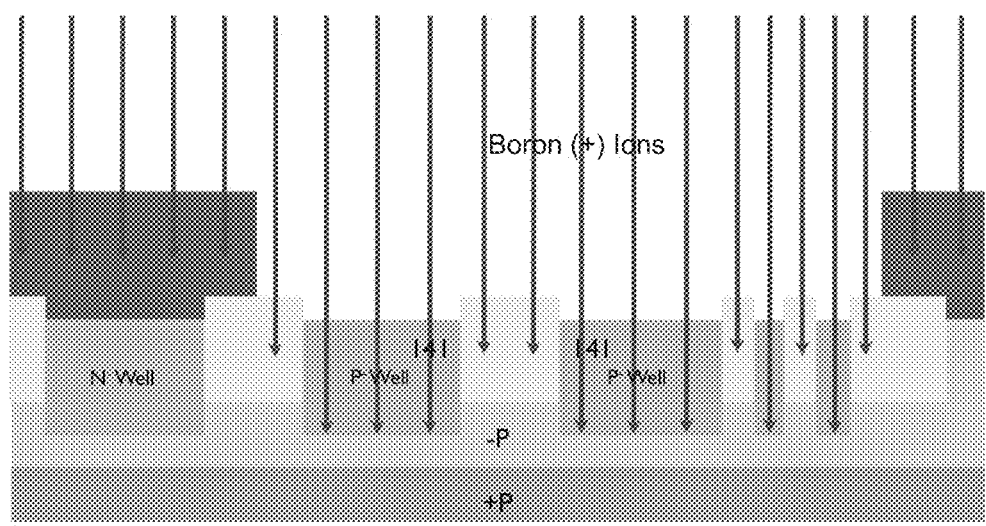

FIG. 14 shows the substrate in cross section during P-well implantation. A deep (high-energy) implant of boron ions creates a localized P-type region 141 for the NMOS transistor.

Figure 15:
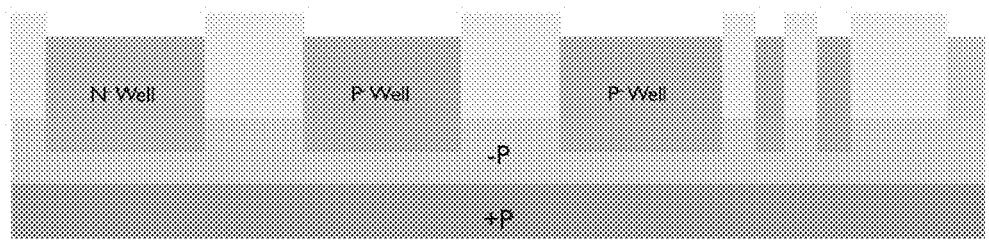

FIG. 15 shows the substrate in cross section following photoresist removal. An oxygen plasma is used to burn off any remaining photoresist.

Figure 16:
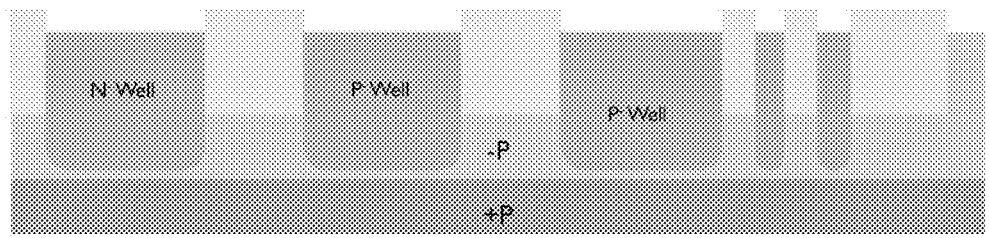

FIG. 16 shows the substrate in cross section following the annealing of the well implants. This step repairs damage to the silicon surface caused by the bombardment by implant ions and electrically activates the dopants. It also causes the dopants to spread somewhat deeper, but Rapid Thermal Annealing (RTA) can minimize this dopant spreading. Optionally, this step can be omitted if the thermal budget of the subsequent epi-silicon growth step is sufficient to effect this annealing operation.

Figure 17:
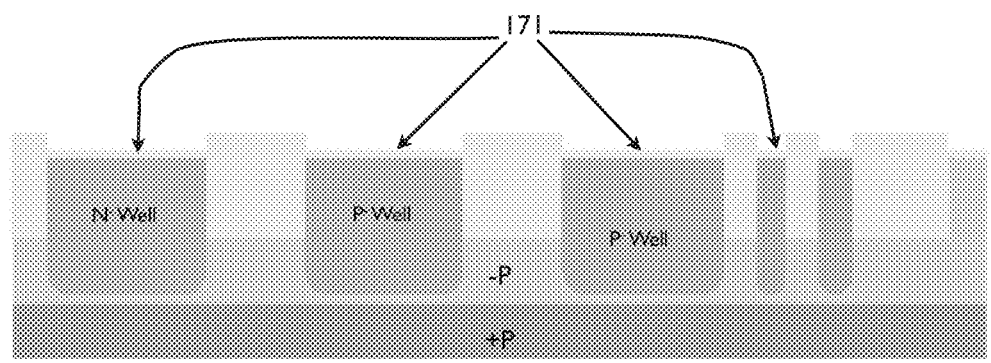

FIG. 17 shows the substrate in cross section following the growth of a sacrificial oxide 171. This thin oxide layer is grown to capture defects in the silicon surface to create a more perfect surface for the formation of the gate regions for the MOS transistors.

Figure 18:
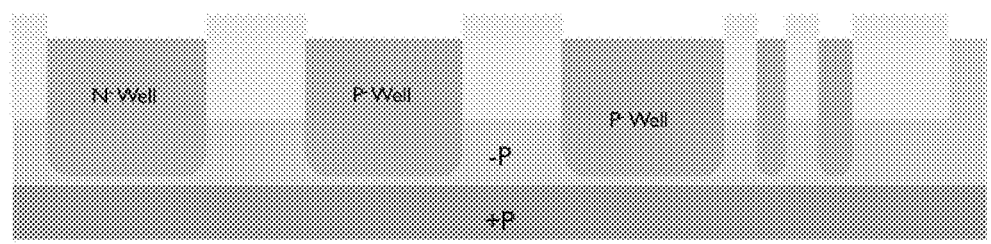

FIG. 18 shows the substrate in cross section following the remove of this sacrificial oxide. The sacrificial oxide removed removed immediately after it is formed by dipping the wafer in a wet HF solution, leaving behind a clean silicon surface.

Figure 19:
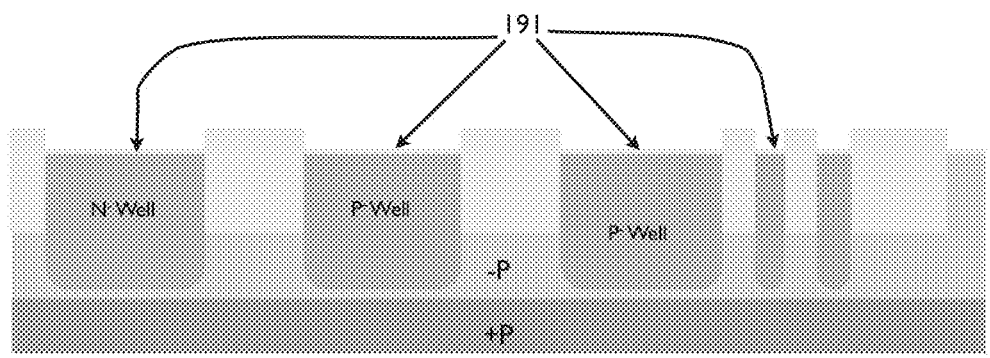

FIG. 19 shows the substrate in cross section following growth of a gate oxide 191. This is the most critical step in the CMOS process. A very thin oxide layer is grown that will serve as the gate dielectric for both transistors. It must be extremely clean, and is grown to a very precise thickness (+/− 1 Å); it is to meet these requirements that the present invention does not change the CMOS process until after the following step of gate poly-silicon deposition.

Figure 20:
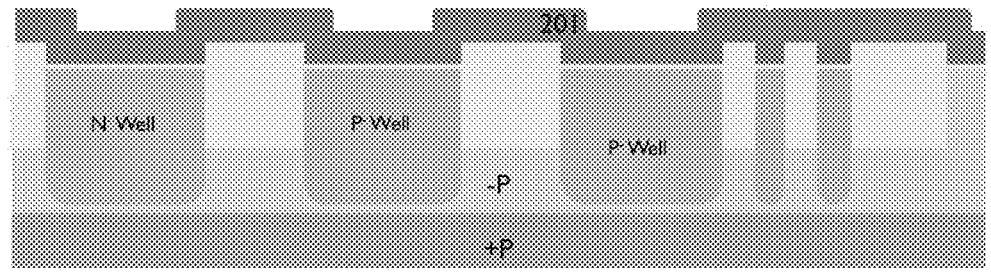

FIG. 20 shows the substrate in cross section following the deposition of the gate poly-silicon 201. This poly-crystalline silicon layer is deposited using Chemical Vapor Deposition (CVD). Once deposited, the gate region and the gate oxide of the MOS transistors is protected. At this point, according to the present invention, the steps to incorporate the diode array can begin to be added.

Figure 21:
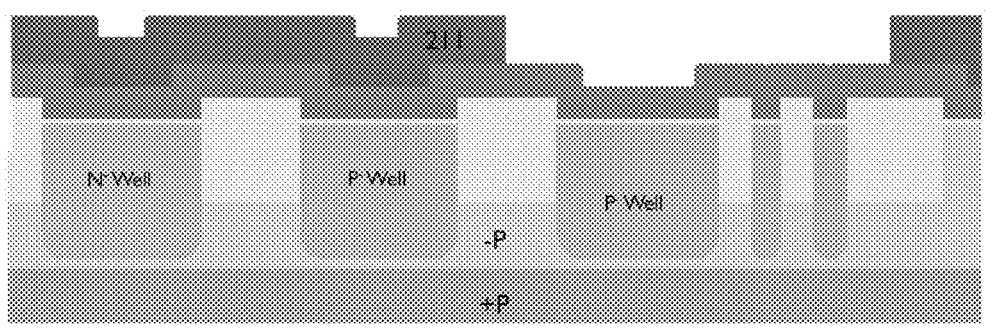

FIG. 21 shows the substrate in cross section following spin-on, exposure, and development of photoresist 211 for the definition of the diode array areas. This is a non-critical mask step and it provides a large opening to expose the entire diode array. This is the first step incorporated solely to provide the benefit of the present invention. This is the first of up to three times that this diode array area mask is used.

Figure 22:
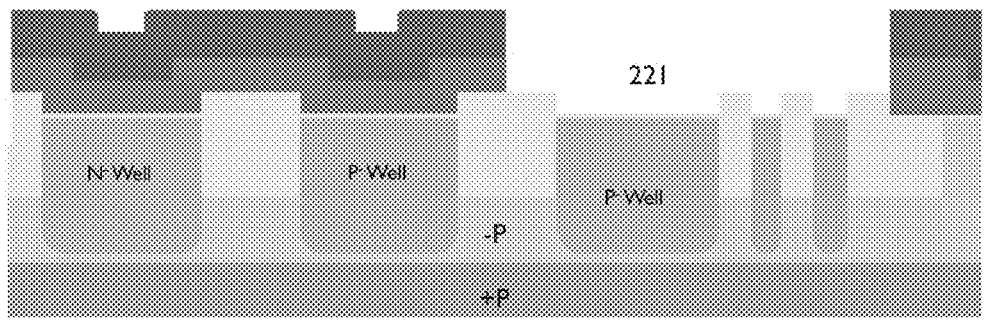

FIG. 22 shows the substrate in cross section following the etching away of the poly-silicon over the diode array areas 221. This step is performed by a Reactive Ion Etch (RIE) in which a fluorine chemistry is used.

Figure 23:
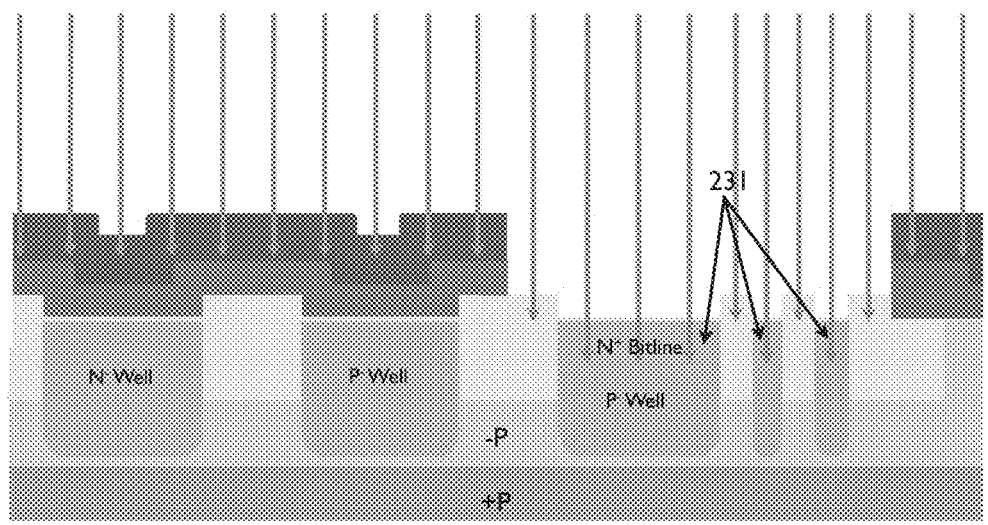

FIG. 23 shows the substrate in cross section during N-type implantation. An implant of phosphorous ions creates a localized N-type region 231 for the bit-lines.

Figure 24:
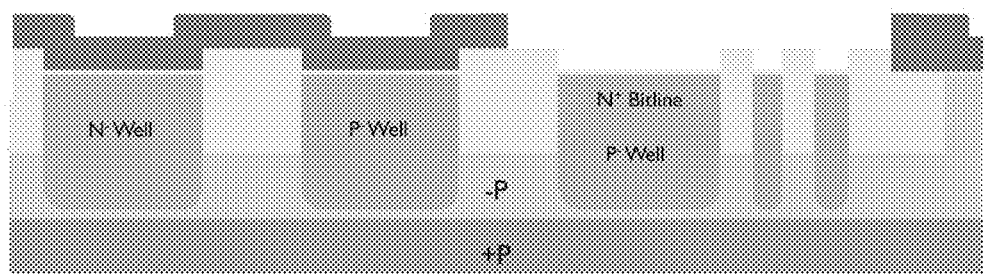

FIG. 24 shows the substrate in cross section following photoresist removal. An oxygen plasma is used to burn off any remaining photoresist.

Figure 25:
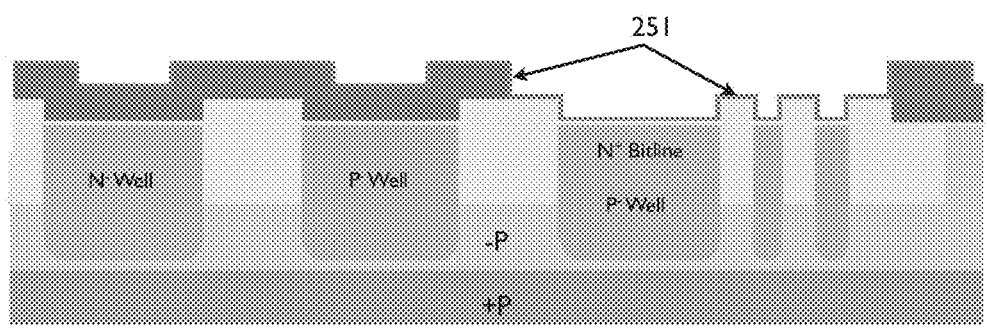

FIG. 25 shows the substrate in cross section following the deposition of Silicon Nitride (SiN$_x$). This SiN$_x$ layer 251 is deposited using Chemical Vapor Deposition (CVD). This layer serves as an etch stop layer during the formation of the diode holes prior to epi-silicon growth.

Figure 26:
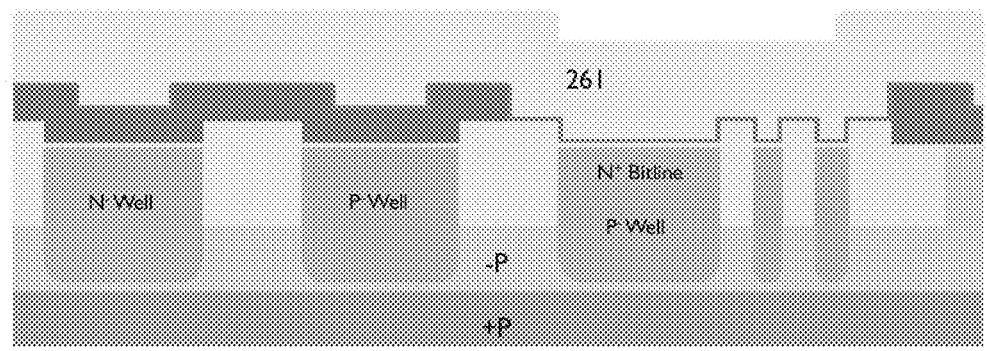

FIG. 26 shows the substrate in cross section following the deposition of a High Density Plasma (HDP) silicon dioxide 261 for the diode array areas. This is deposited using Chemical Vapor Deposition. It's thickness should allow for the height of the diodes desired after CMP steps.

Figure 27:
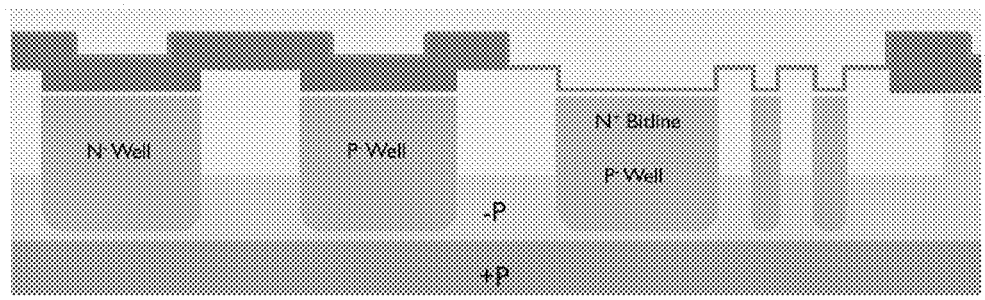

FIG. 27 shows the substrate in cross section following planarization of the HDP diode array area oxide. The surface oxide is removed using Chemical Mechanical Polishing (CMP). This CMP process is a timed step. Alternatively, the gate poly-silicon thickness could be matched to the diode height enabling this step to be is formulated to stop (i.e., significantly slow down) when it hits the layer of silicon nitride.

Figure 28:
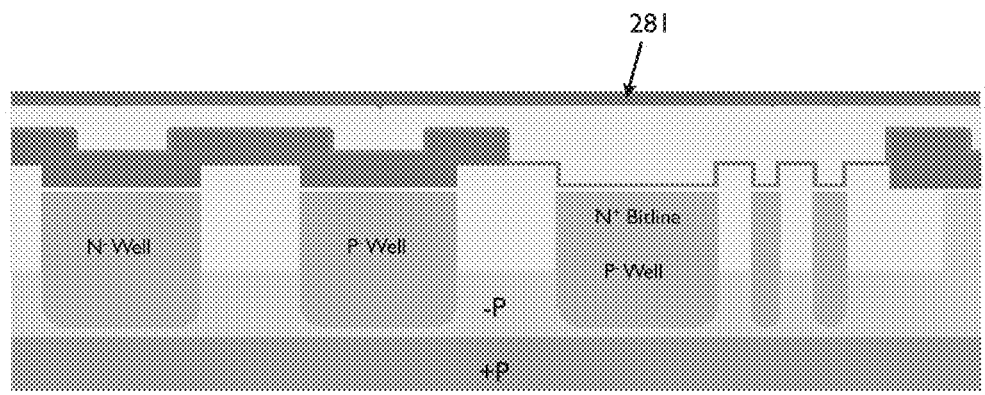

FIG. 28 shows the substrate in cross section following deposition of a hard-mask poly-silicon layer 281. This polycrystalline silicon layer is deposited using Chemical Vapor Deposition (CVD). This poly-silicon layer will provide an etch mask during the deep hole etch for forming the diodes. It's presence is typically required because the holes to form the diodes are printed at the critical geometry and therefore will require a thin photoresist layer to print; since the holes are etched deep, the photoresist may be etched away before the holes are fully etched and this hard mask will provide the extra etch time to complete the hole etch.

Figure 29:
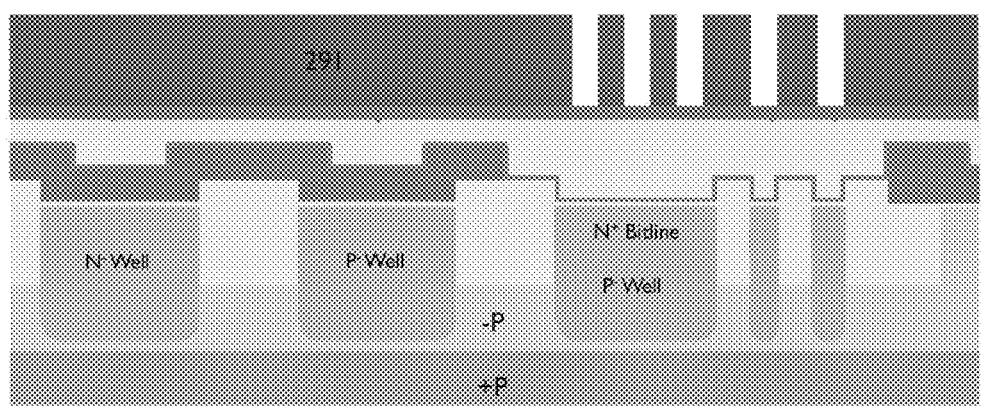

FIG. 29 shows the substrate in cross section following spin-on, exposure, and development of photoresist 291 for the definition of the diode array diode holes. This is the one critical mask step introduced according to the present invention and it provides a small hole for each diode in the diode array.

Figure 30:
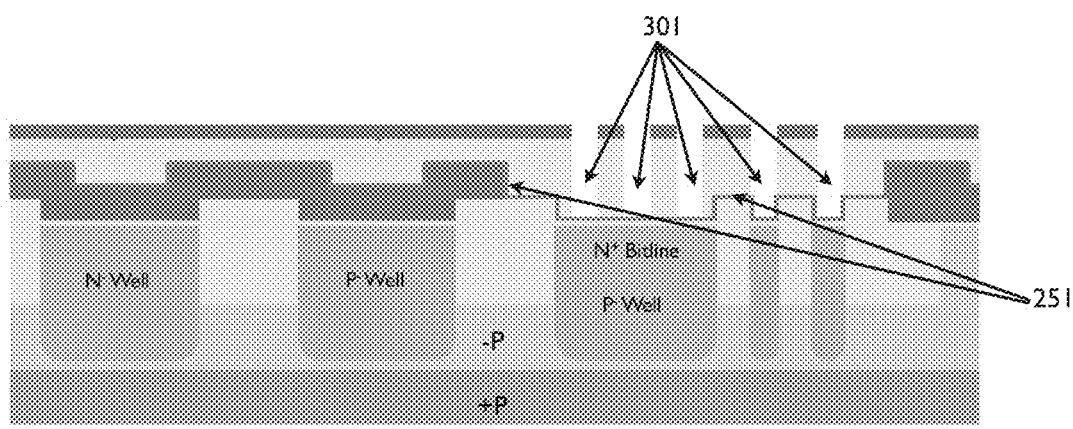

FIG. 30 shows the substrate in cross section following the etching through of the poly-silicon hard mask and the etching through of the HDP oxide to form holes 301 for all of the diodes in the diode array areas. This step is performed by a Reactive Ion Etch (RIE) in which two fluorine chemistries are used—the first chemistry is selective to etch poly-silicon and the second selectively etches oxide preferentially over both silicon and silicon nitride. As a result, the etch will stop on the silicon nitride layer 251 and will not eliminate the hard-mask needed to define the holes during the etch. These etch chemistries are well known to those skilled in the art. By the end of the oxide etch, the photoresist will be fully etched away resulting in there being no photoresist removal step required.

Figure 31:
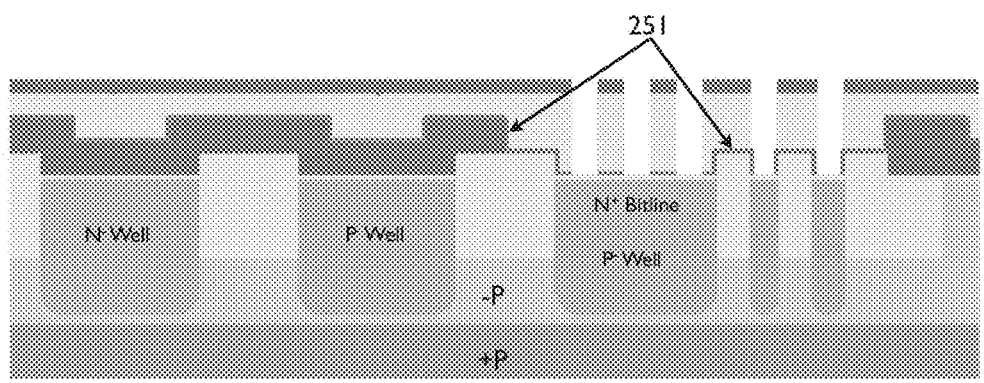

FIG. 31 shows the substrate in cross section following the etching through of the silicon nitride layer 251 over the bit-lines in the diode array areas. This step is performed by a Reactive Ion Etch (RIE) in which a fluorine chemistry is used.

Figure 32:
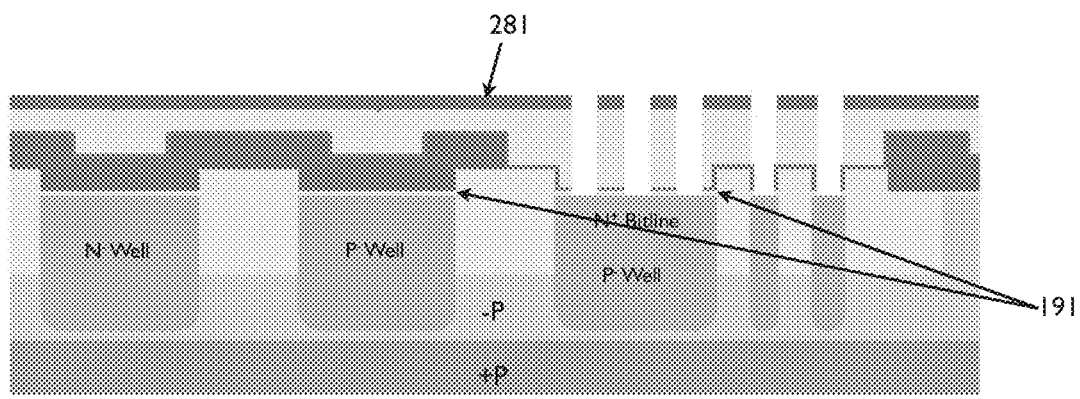

FIG. 32 shows the substrate in cross section following the etching through of the silicon oxide gate oxide layer 191 over the bit-lines in the diode array areas. This step is performed by a Reactive Ion Etch (RIE) in which a fluorine chemistry is used.

Figure 33:
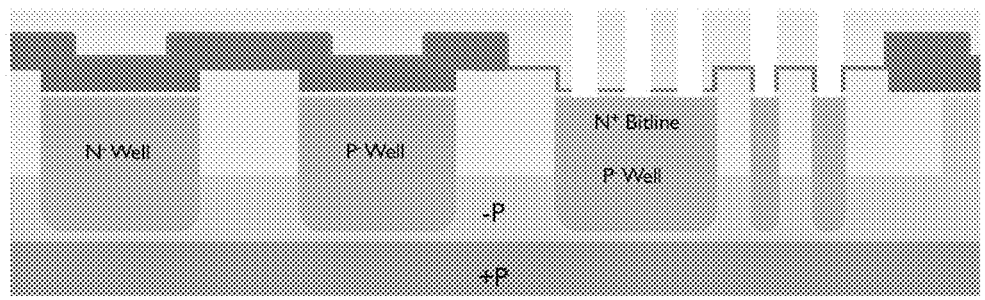

FIG. 33 shows the substrate in cross section following the removal of the poly-silicon hard mask 281. This can be performed by a Reactive Ion Etch (RIE) in which a fluorine chemistry is used or etched by wet chemistry. To minimize the cumulative current leakage in very large diode arrays, one can reduce damage to the surface of the bit-lines where each diode is to be grown and this poly-silicon removal step can be performed prior to the etching through of the silicon oxide gate oxide layer (or prior to the etching through of both the silicon nitride layer and the silicon oxide gate oxide layer).

Figure 34:
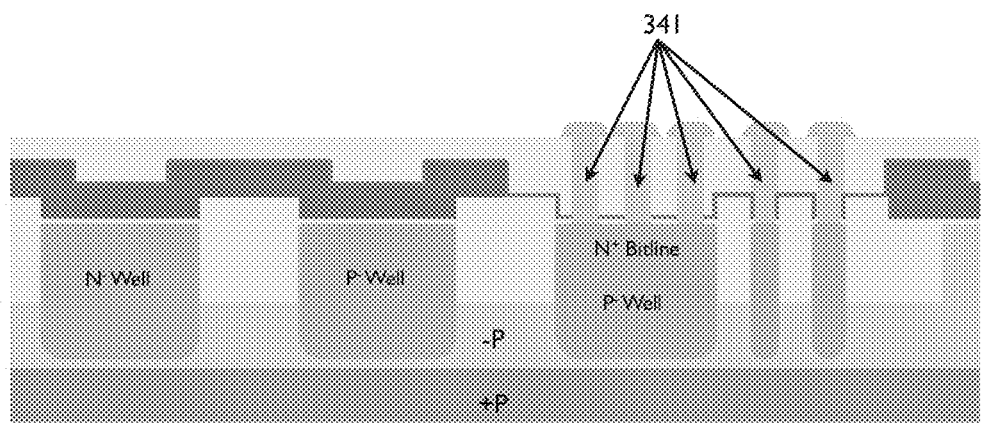

FIG. 34 shows the substrate in cross section following epitaxial silicon growth. This epi-silicon growth is a selective epi-silicon growth step and, as such, new silicon 341 only forms on existing silicon (hence, the poly-silicon of the hard mask must be fully removed to prevent undesired silicon growth). This epi-silicon is formed at elevated temperatures (500° C.-900° C.) and, according to the present invention, must be performed prior to salicide contact formation on the MOS transistor gates, sources and drains.

Figure 35:
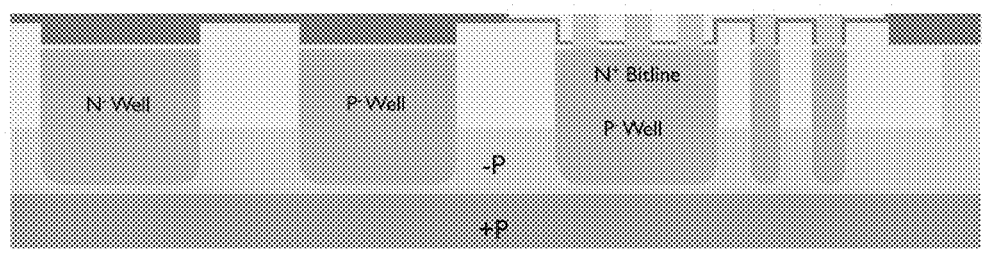

FIG. 35 shows the substrate in cross section following planarization of the epi-silicon diode array area diodes. The surface epi-silicon is removed using Chemical Mechanical Polishing (CMP). This CMP process is run until the remaining gate poly-silicon is exposed. This step completes the formation of the body of the diodes of the memory arrays. All that remains to complete the diodes is to implant the anode areas of the diodes.

Figure 36:
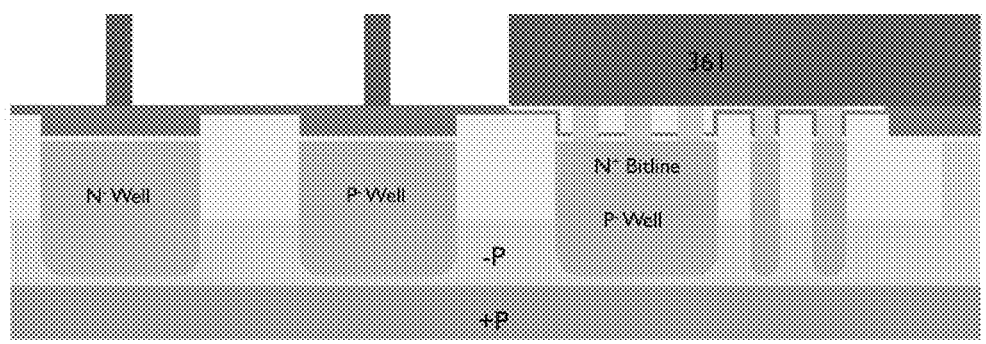

FIG. 36 shows the substrate in cross section following spin-on, exposure, and development of the photoresist 361 to define the transistor gate electrodes. This is the most critical patterning step in the CMOS part of the process. Precise sizing of the poly gate length is a first-order determinant of transistor switching speed. The highest resolution patterning systems are used (i.e. DUV) along with a thin layer of photoresist due to the critical nature of the layer.

Figure 37:
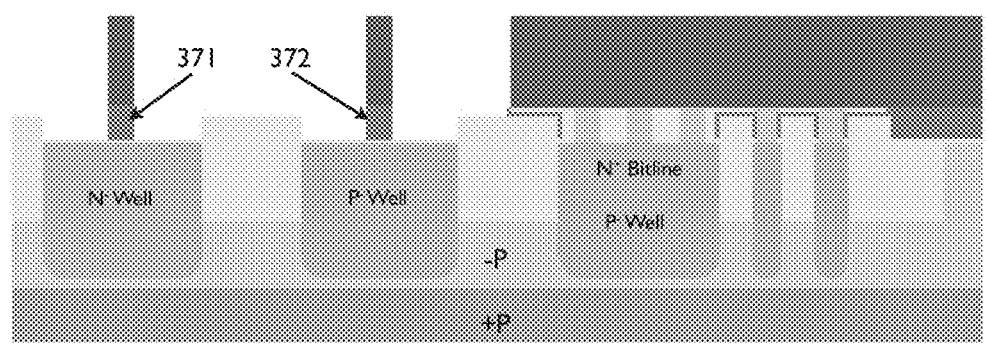

FIG. 37 shows the substrate in cross section following the etch of the gate poly-silicon. A Reactive Ion Etch (RIE) utilizing fluorine chemistry is used. The PMOS transistor gates 371 are formed in the same step as the NMOS transistor gates 372. The completes the formation of the "gate stack."

Figure 38:
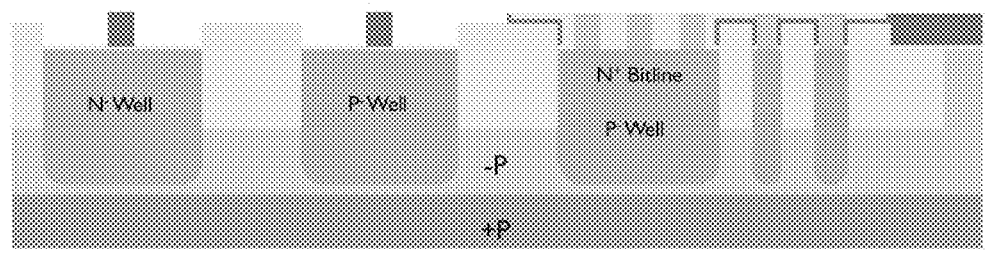

FIG. 38 shows the substrate in cross section following photoresist removal. An oxygen plasma is used to burn off any remaining photoresist.

Figure 39:
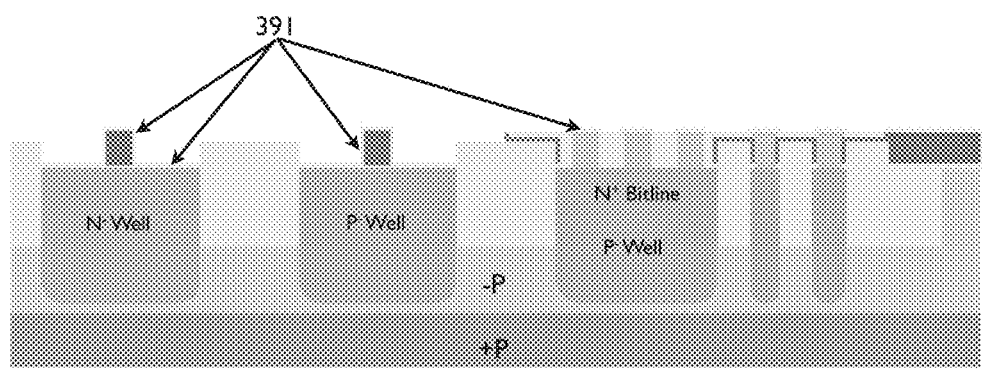

FIG. 39 shows the substrate in cross section following oxidization of the gate poly-silicon. A thin layer of oxide 391 is grown on top of the poly-silicon gate (and upon any exposed silicon) to act as a buffer between the poly-silicon and a subsequent silicon nitride layer.

Figure 40:
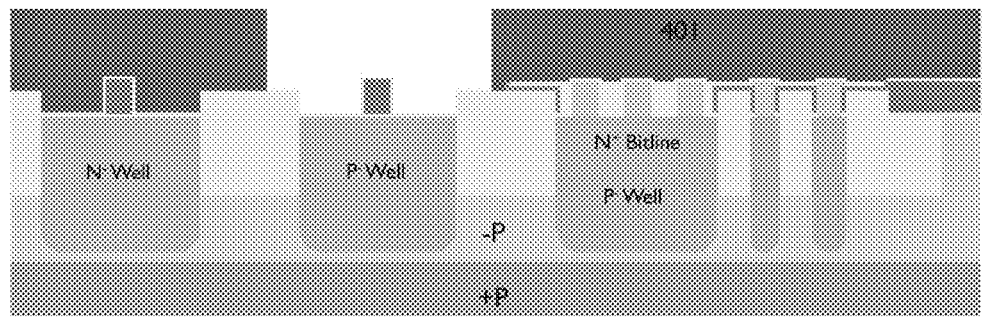

FIG. 40 shows the substrate in cross section following spin-on, exposure, and development of the photoresist 401 to define the NMOS transistor tip implant. The "tip" serves to reduce hot electron effects near the gate regions in the NMOS transistors.

Figure 41:
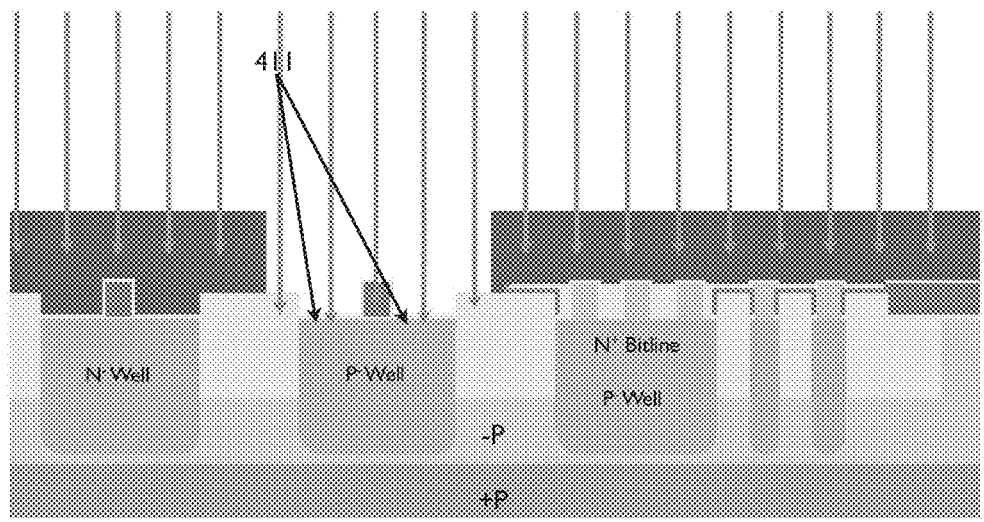

FIG. 41 shows the substrate in cross section during the NMOS transistor tip implant: A very shallow (low energy) and low dose implant of arsenic ions begins the formation of the NMOS transistor source and drain regions and implants the NMOS transistor tip implant 411.

Figure 42:
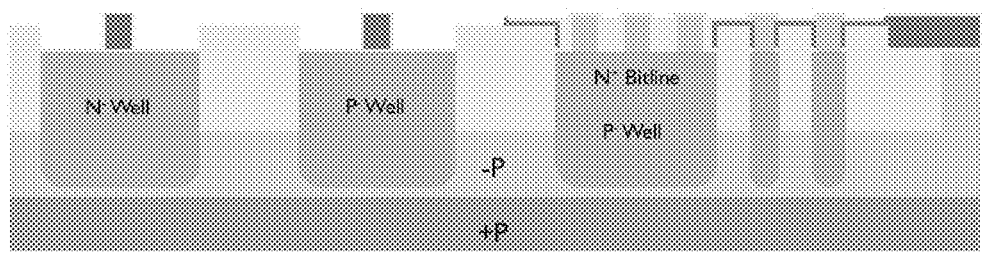

FIG. 42 shows the substrate in cross section following photoresist removal. An oxygen plasma is used to burn off any remaining photoresist.

Figure 43:
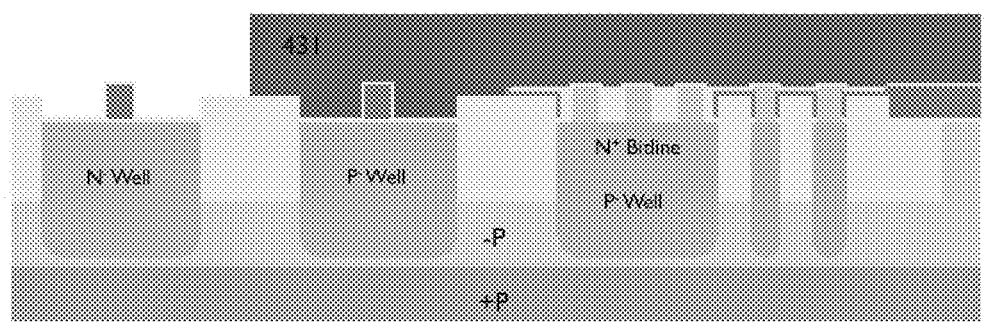

FIG. 43 shows the substrate in cross section following spin-on, exposure, and development of the photoresist 431 to define the PMOS transistor tip implant. The "tip" serves to reduce hot electron effects near the gate regions in the PMOS transistors.

Figure 44:
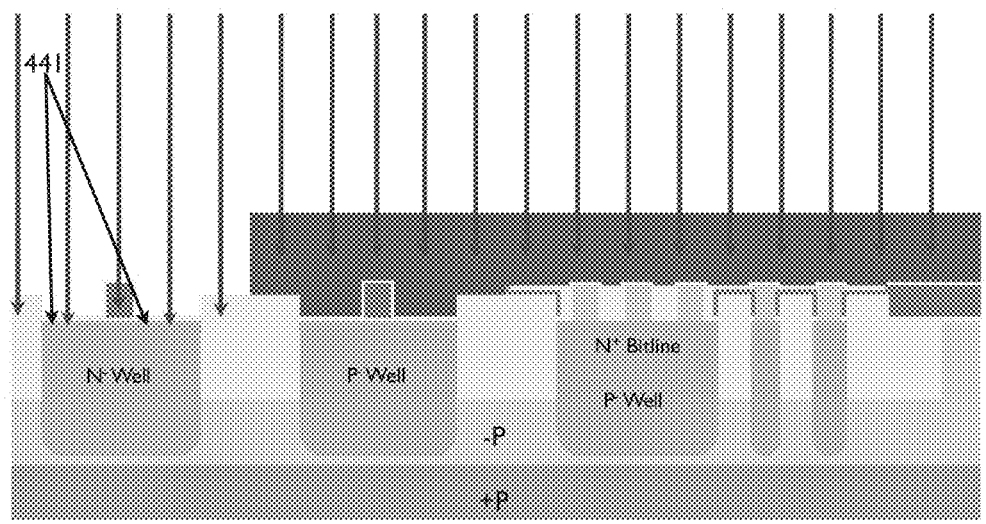

FIG. 44 shows the substrate in cross section following during the NMOS transistor tip implant: A very shallow (low energy) and low dose implant of $BF_2$ ions begins the formation of the PMOS transistor source and drain regions and implants the PMOS transistor tip implant 441.

Figure 45:
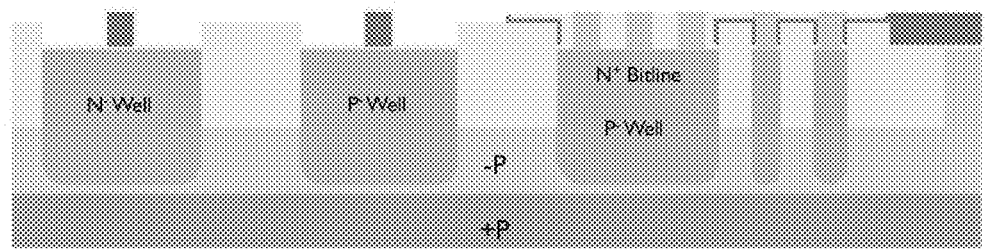

FIG. 45 shows the substrate in cross section following photoresist removal. An oxygen plasma is used to burn off any remaining photoresist.

Figure 46:
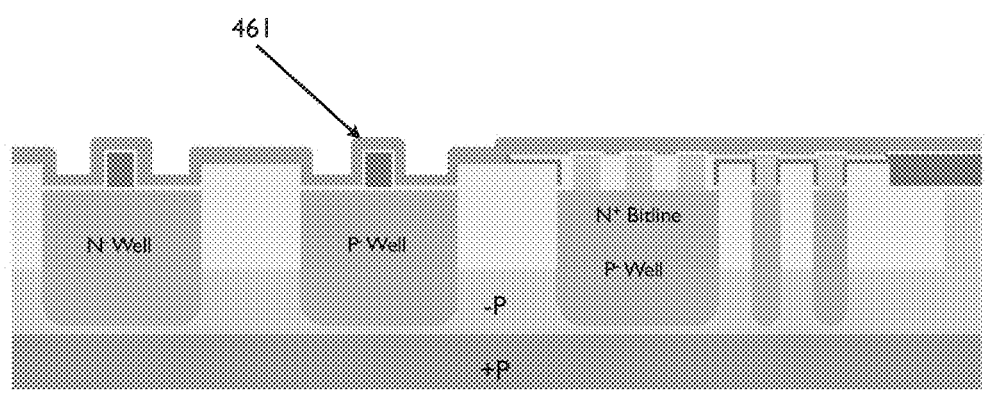

FIG. 46 shows the substrate in cross section following the deposition of a silicon nitride layer 461 using Chemical Vapor Deposition (CVD). This is the first step of forming a nitride spacer as is well known in the art.

Figure 47:
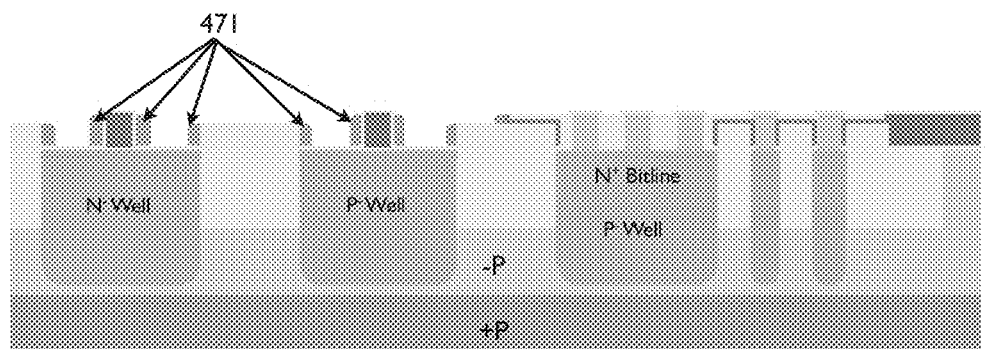

FIG. 47 shows the substrate in cross section following a timed nitride etch to form spacer sidewalls 471. This is a carefully controlled Reactive Ion Etch (RIE) etch that removes the thin nitride from the horizontal surfaces, but will leave the sidewalls 471. These sidewalls will position the implants precisely to form the transistor sources and drains.

Figure 48:
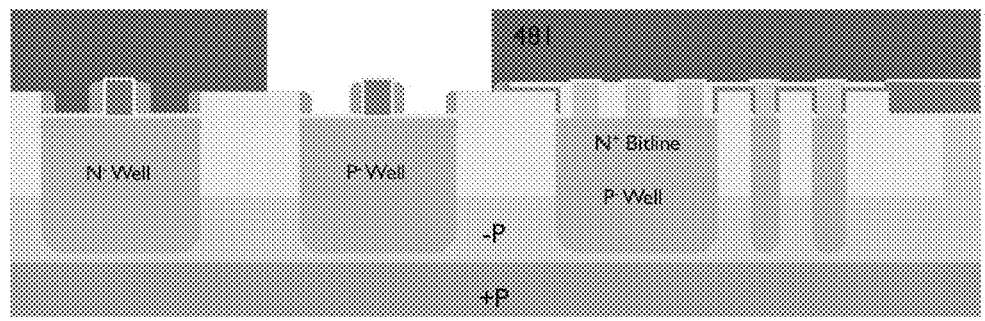

FIG. 48 shows the substrate in cross section following the spin-on, exposure, and development of the photoresist 481 to define the NMOS transistor source and drain implant. This is a non-critical mask.

Figure 49:
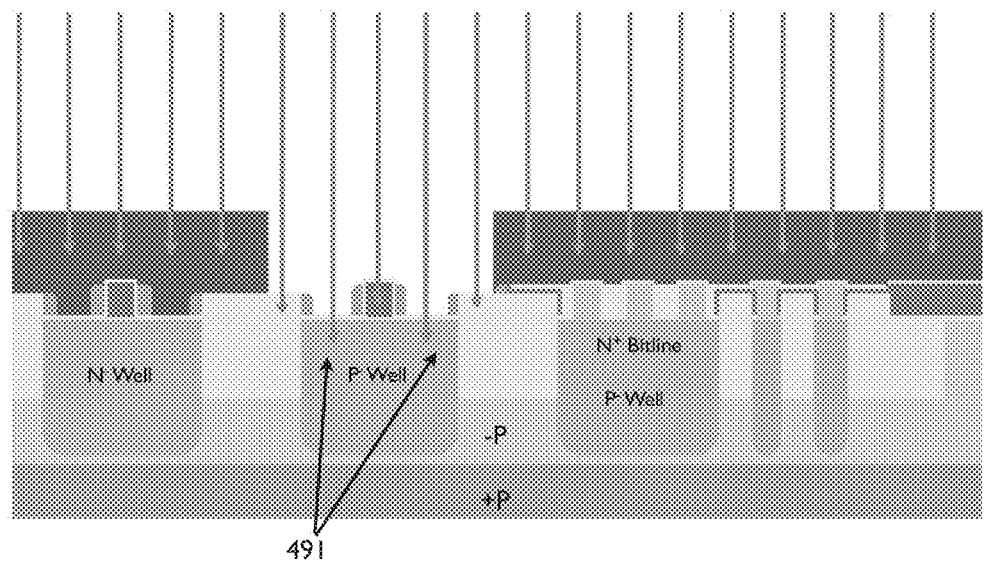

FIG. 49 shows the substrate in cross section during the NMOS transistors' source and drain implant 491. A shallow and high-dose implant of arsenic ions creates a heavily-doped NMOS transistor source and drain. The spacer shields this implant from falling too near to the channel region.

Figure 50:
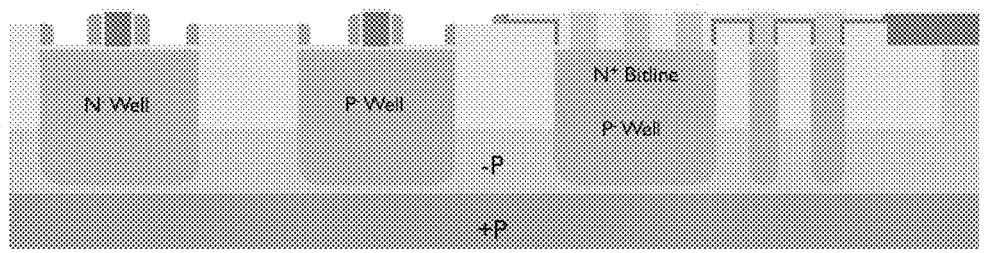

FIG. 50 shows the substrate in cross section following photoresist removal. An oxygen plasma is used to burn off any remaining photoresist.

Figure 51:
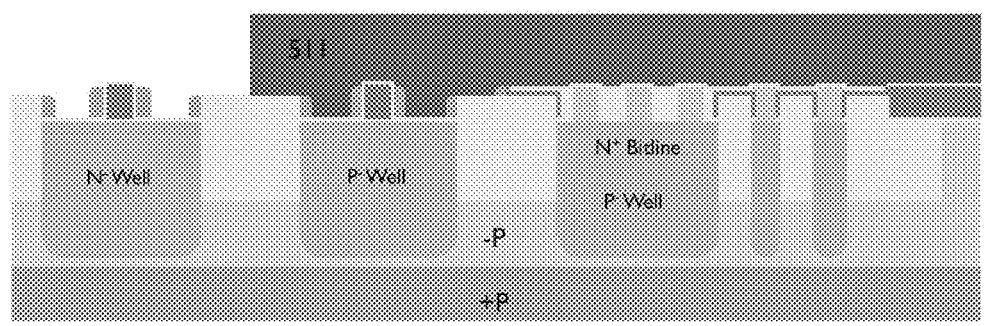

FIG. 51 shows the substrate in cross section following the spin-on, exposure, and development of the photoresist 511 to define the PMOS transistor source and drain implant. This is a non-critical mask.

Figure 52:
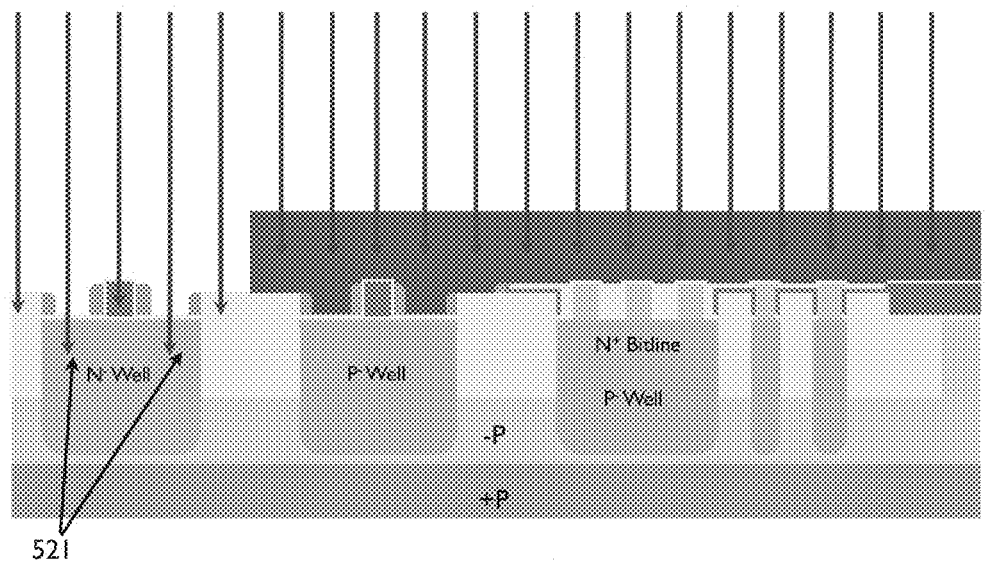

FIG. 52 shows the substrate in cross section during the PMOS transistors' source and drain implant 521. A shallow and high-dose implant of $BF_2$ ions creates a heavily-doped PMOS transistor source and drain. The spacer shields this implant from falling too near to the channel region.

Figure 53:
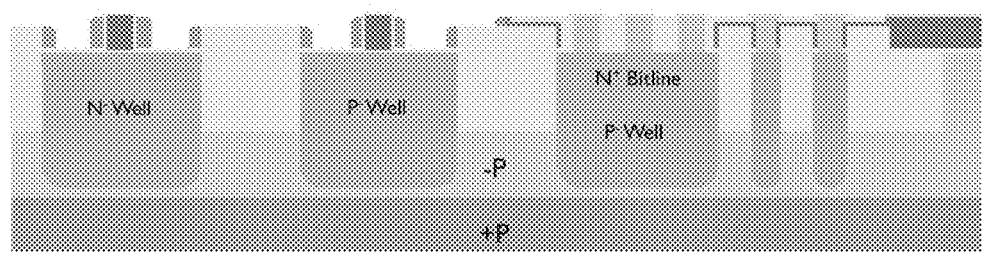

FIG. 53 shows the substrate in cross section following photoresist removal. An oxygen plasma is used to burn off any remaining photoresist.

Figure 54:
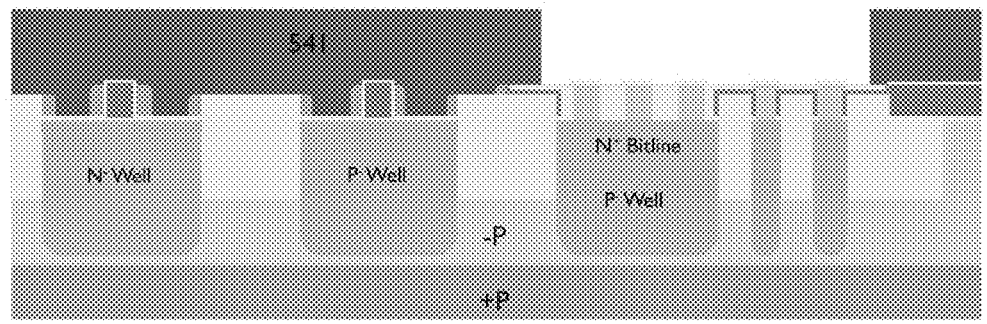

FIG. 54 shows the substrate in cross section following the spin-on, exposure, and development of the photoresist 541 to define the diode's anode implant. This is the second use of this non-critical mask. Note that by fine-tuning the thickness of the photoresist for the PMOS transistors' source and drain implant step, this photo step and the subsequent implant and resist strip steps might be eliminated.

Figure 55:
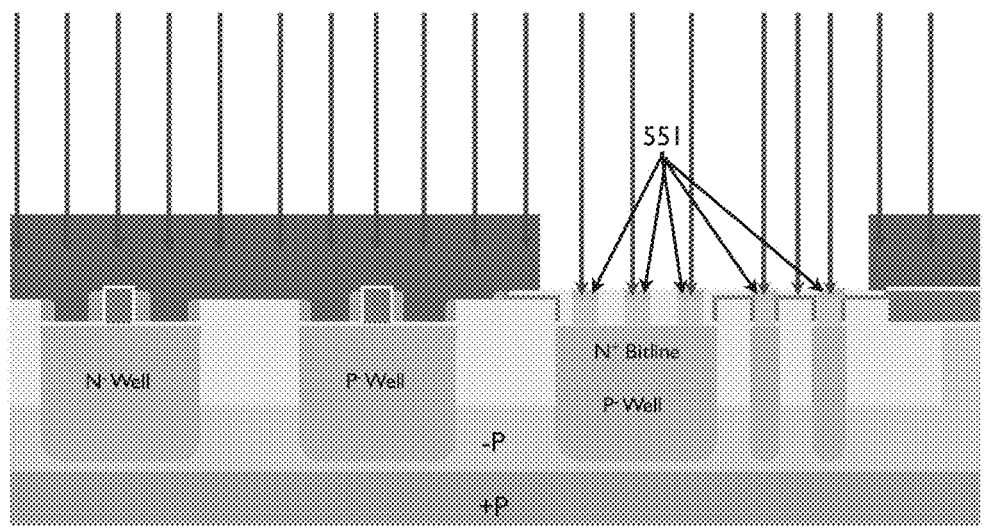

FIG. 55 shows the substrate in cross section during the diodes' anode implant. A shallow and high-dose implant of $BF_2$ ions creates a heavily-doped anode 551 on the diodes.

Figure 56:
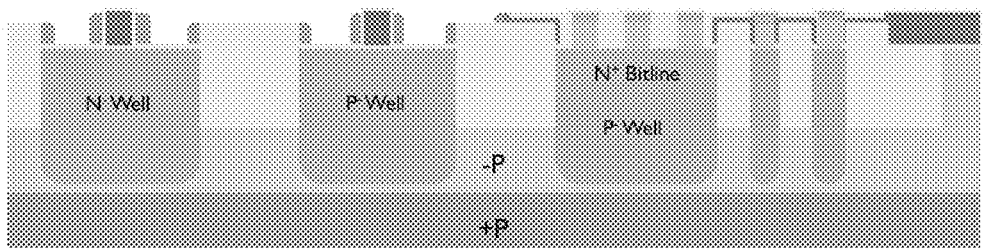

FIG. 56 shows the substrate in cross section following photoresist removal. An oxygen plasma is used to burn off any remaining photoresist.

Figure 57:
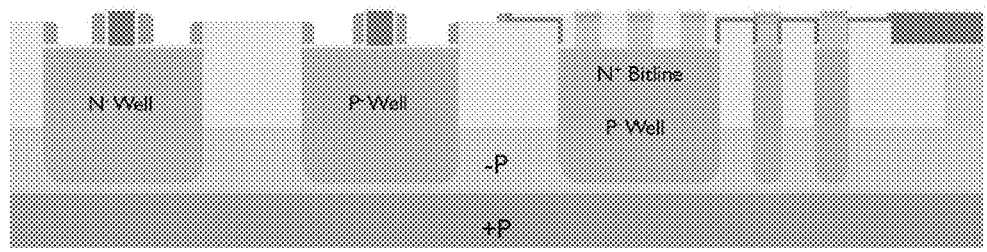

FIG. 57 shows the substrate in cross section following the annealing of the MOS transistors' source and drain implants and the diodes' anode implants. The use of Rapid Thermal Annealing (RTA) minimizes dopant migration in the shallow source and drains. The MOS transistors and diodes are now fully formed. All that remains is to apply the information storage elements and to connect everything together.

Figure 58:
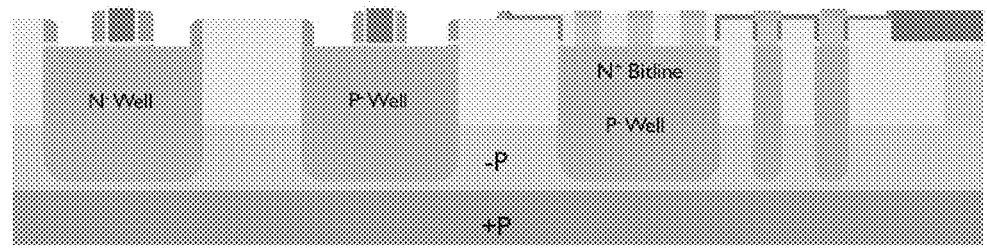

FIG. 58 shows the substrate in cross section following the stripping of the surface oxides. A quick dip in HF will remove any exposed gate oxide and expose bare silicon in the source, the poly-silicon gate, and the drain areas. Any native oxide that may have formed upon the diode anodes will likewise be removed.

Figure 59:
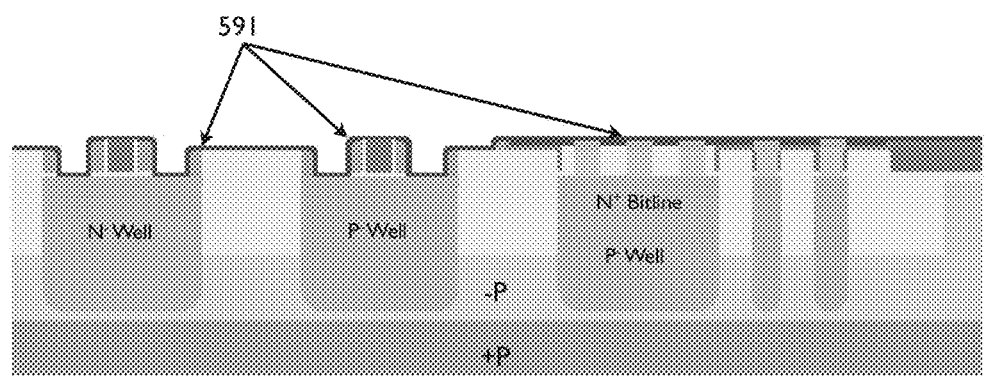

FIG. 59 shows the substrate in cross section following the deposition of a thin layer of Titanium 591 by sputtering across the entire wafer surface.

Figure 60:
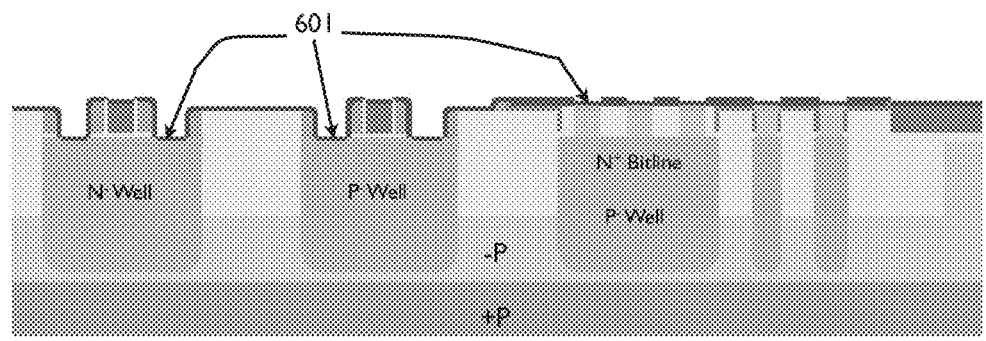

FIG. 60 shows the substrate in cross section following the formation of titanium silicide. This is done by Rapid Thermal Processing in nitrogen at 800° C. and causes the titanium to react with silicon, forming titanium silicide, where the titanium contacts silicon 601. In other areas, the titanium is unaffected. This process perfectly aligns the silicide to the exposed silicon, and is called Self-Aligned Silicide, or Salicide.

Figure 61:
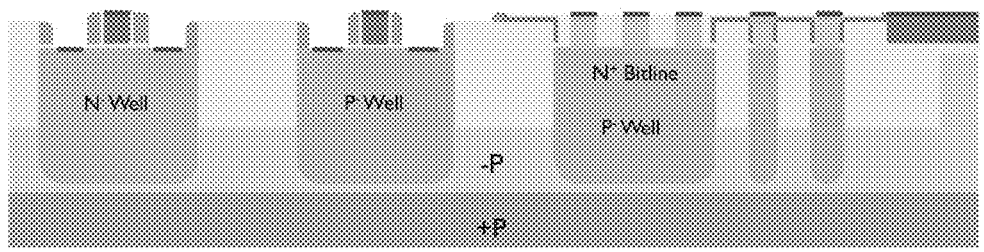

FIG. 61 shows the substrate in cross section following a titanium etch: The unreacted titanium is removed using a wet etch in $NH_4OH+H_2O_2$, but the titanium silicide remains. $TiSi_2$ provides an ohmic contact between silicon and subsequently deposited metal.

Figure 62:
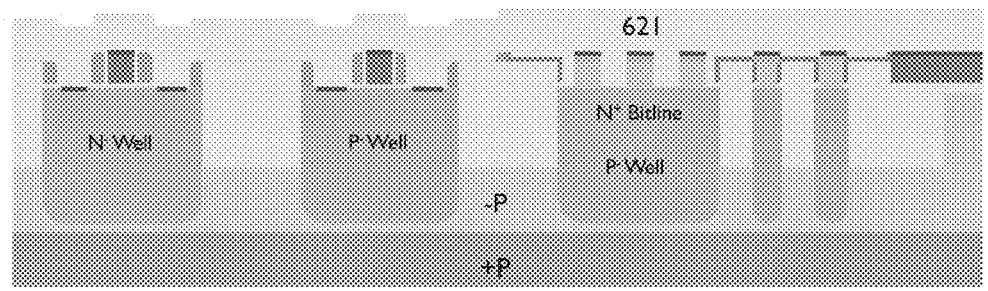

FIG. 62 shows the substrate in cross section following field oxide deposition 621. Through this oxide the contacts will be formed to connect to the transistors and to form cups to create the information storage elements.

Figure 63:
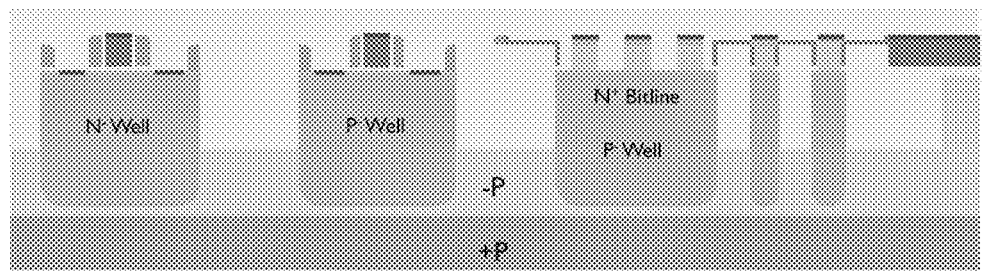

FIG. 63 shows the substrate in cross section following planarization of the field oxide. The surface oxide is removed using Chemical Mechanical Polishing (CMP). This CMP process is a timed step. This step provides a smooth surface for the subsequent critical photolithography step.

Figure 64:
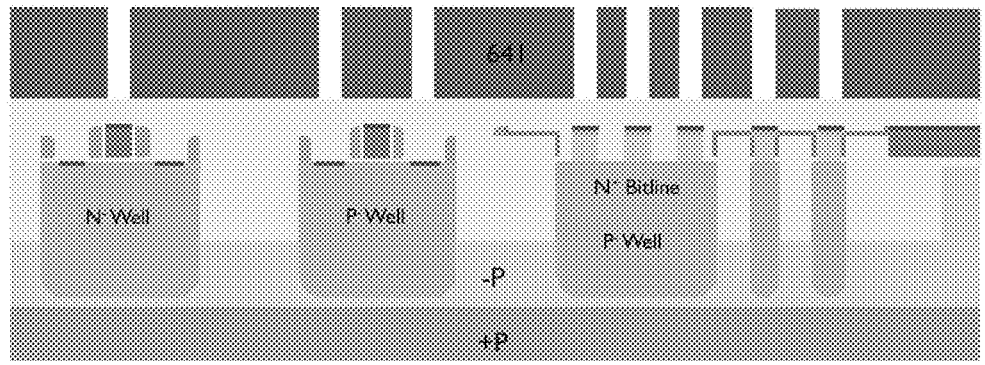

FIG. 64 shows the substrate in cross section following the spin-on, exposure, and development of photoresist 641 for the definition of the contacts. This is a critical mask and it incorporates the new fine geometry features of the diode array cups. While a contact mask is present in a standard CMOS process without the inclusion of the present invention, this mask might not require the most critical geometry features in a standard CMOS process without the inclusion of the present invention. However, since the transistor contacts can be larger than the critical geometry and the diode contacts have a salicide contact which is very conductive, some misalignment can be tolerated.

Figure 65:
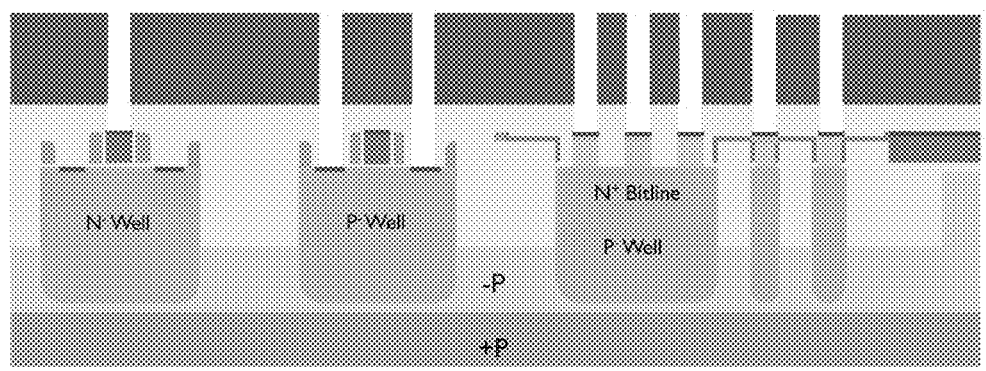

FIG. 65 shows the substrate in cross section following the contact etch: A carefully designed Reactive Ion Etch (RIE) etch using fluorine chemistry is used to achieve vertical sidewalls, as is well known to those skilled in the art.

Figure 66:
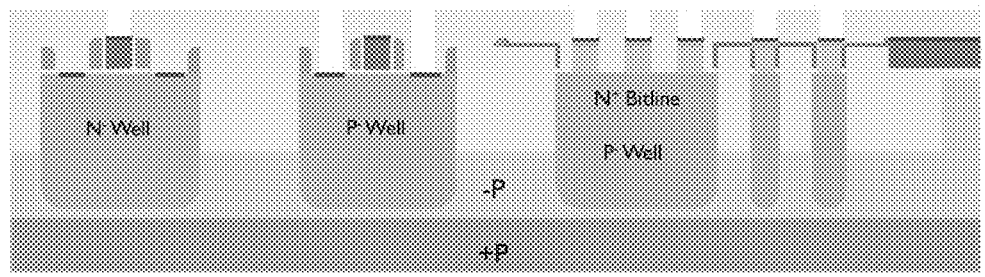

FIG. 66 shows the substrate in cross section following photoresist removal. An oxygen plasma is used to burn off any remaining photoresist.

Figure 67:
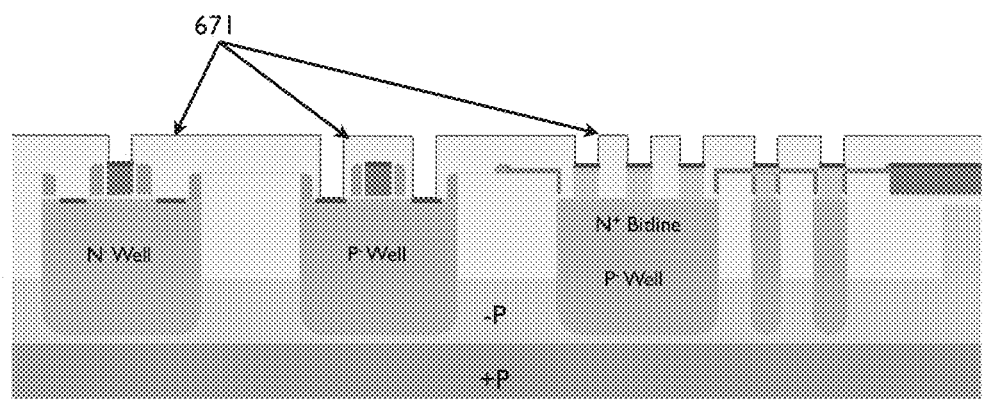

FIG. 67 shows the substrate in cross section following the deposition of titanium nitride (TiN) 671. A sputterer or Atomic Layer Deposition (ALD) is used to deposit a thin adhesion layer of TiN. This layer will help the subsequent tungsten layer to stick to the oxide.

Figure 68:
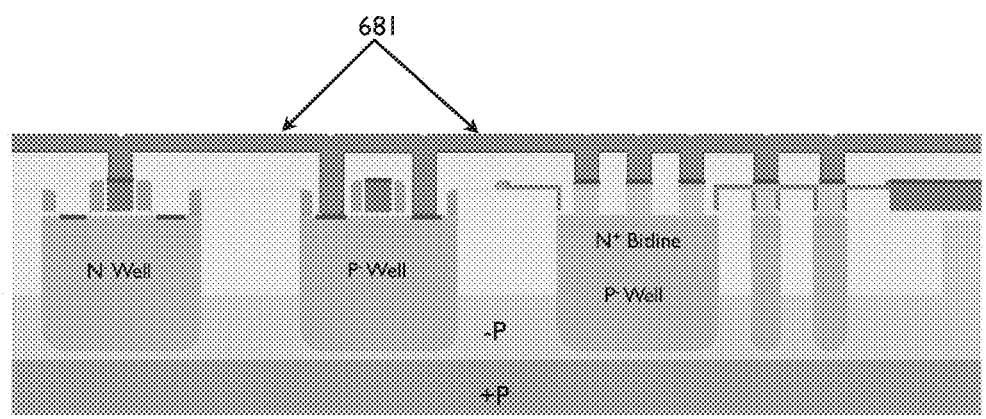

FIG. 68 shows the substrate in cross section following the deposition of tungsten 681. Tungsten is used because it has good conductivity and it deposits conformally (via CVD) and can fill the contact holes. The tungsten thickness must be at least half of the diameter of the contact hole.

Figure 69:
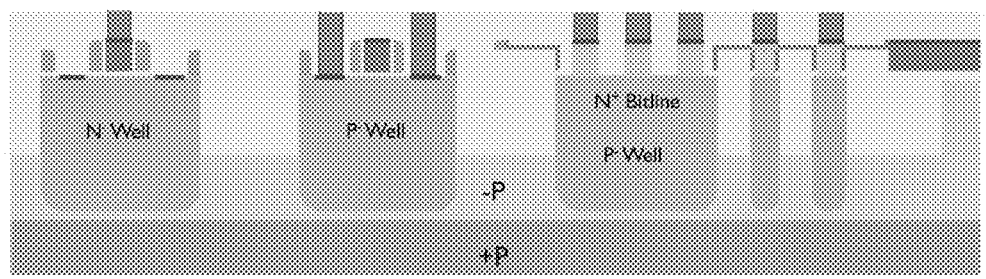

FIG. 69 shows the substrate in cross section following the planarization of the tungsten. CMP is used to remove the surface tungsten. The surface titanium nitride is also removed as well. The remaining tungsten forms contact "plugs". These contact plugs are the contacts that are used to connect the transistor contacts and non-memory diode contacts to the metal interconnects that will be formed during the back end of line (BEOL) processing.

Figure 70:
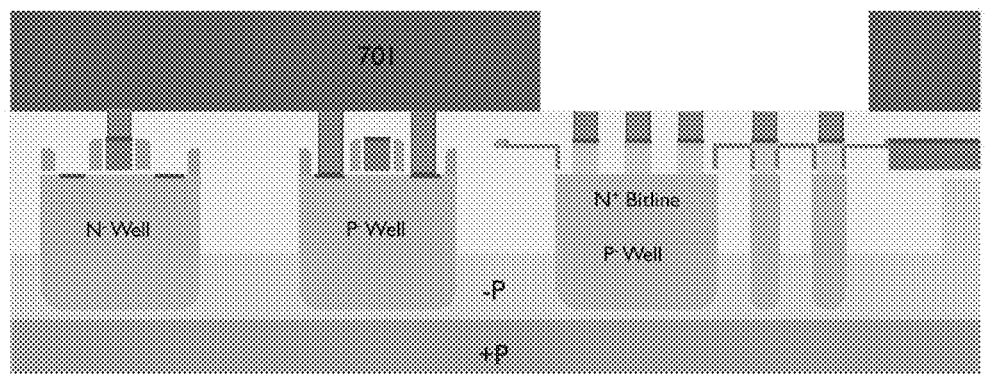

FIG. 70 shows the substrate in cross section following the spin-on, exposure, and development of the photoresist 701 to once again define the diode array areas for the formation of the information storage elements. This is the third and final use of this non-critical mask. Note that if diodes other than memory cell diodes are present in the array formation (i.e., diodes for which an information storage element is not desired), then a new mask will have to be created so as to mask away any diodes not having an information storage element.

Figure 71:
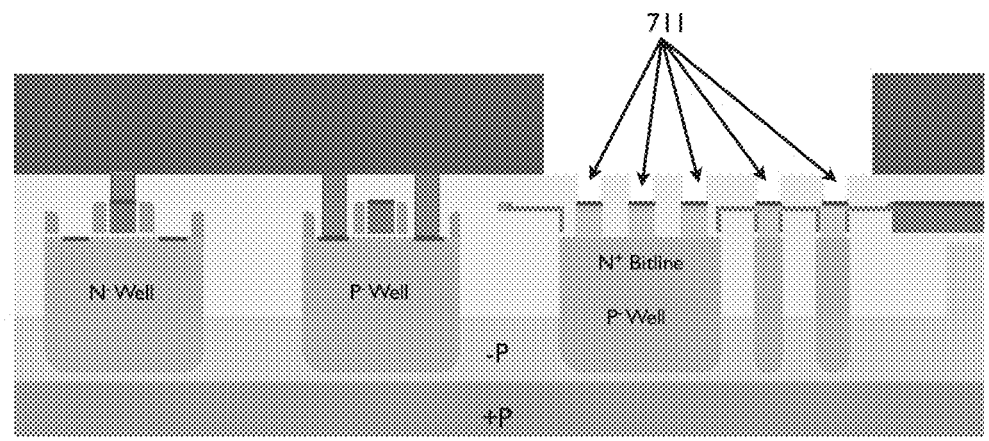

FIG. 71 shows the substrate in cross section following a tungsten etch. An RIE etch will selectively remove the tungsten on top of the memory diodes, leaving the field oxide and forming cups 711 where information storage elements are to be formed.

Figure 72:
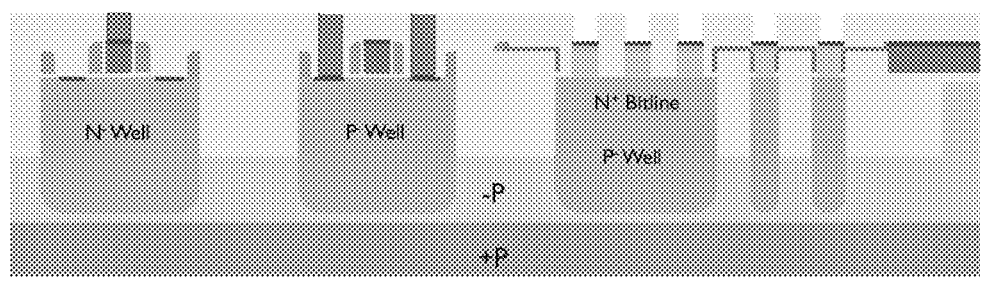

FIG. 72 shows the substrate in cross section following photoresist removal. An oxygen plasma is used to burn off any remaining photoresist.

Figure 73:
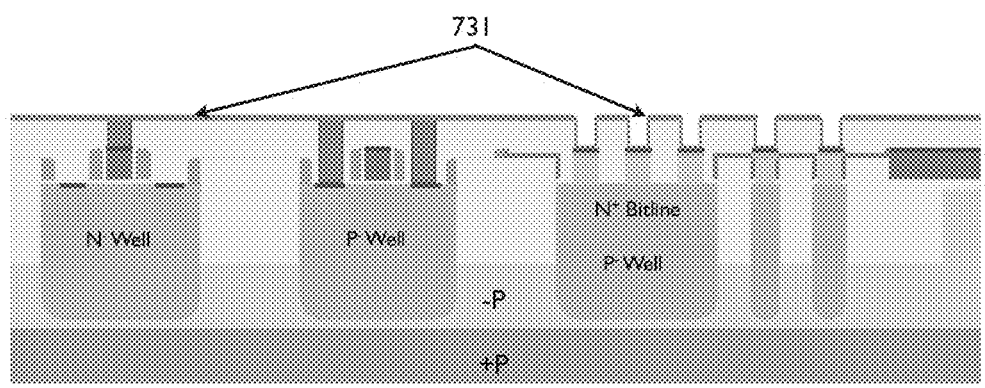

FIG. 73 shows the substrate in cross section following the deposition of a silicon nitride layer 731 using Chemical Vapor Deposition (CVD). This is the same as the first step of forming a nitride spacer as is well known in the art.

Figure 74:
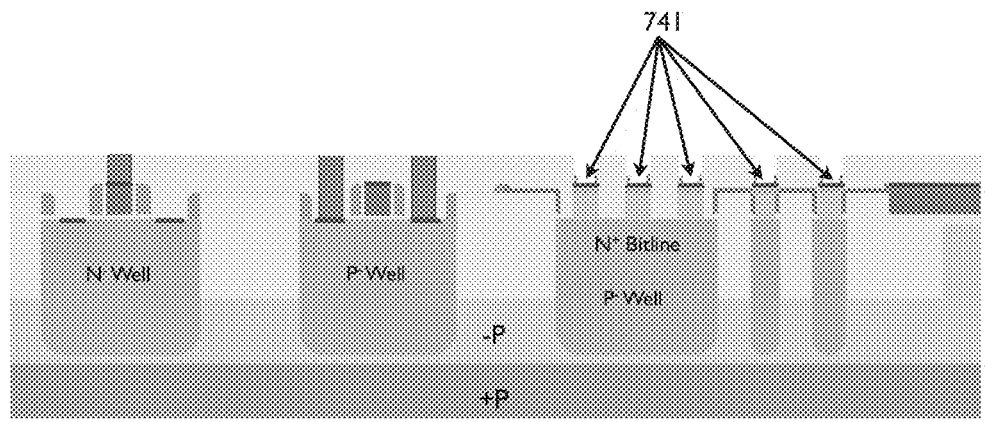

FIG. 74 shows the substrate in cross section following a timed nitride etch to form spacer sidewalls. This is a carefully controlled Reactive Ion Etch (RIE) etch that removes the thin nitride from the horizontal surfaces, but will leave the silicon nitride on the lower sidewalls of the cups. These sidewalls will narrow the diameter of the cup such that this narrowed region 741 will concentrate the current density in the information storage element material. This will result in lower power requirements when the cup is filled with a Chalcogenide material.

Figure 75:
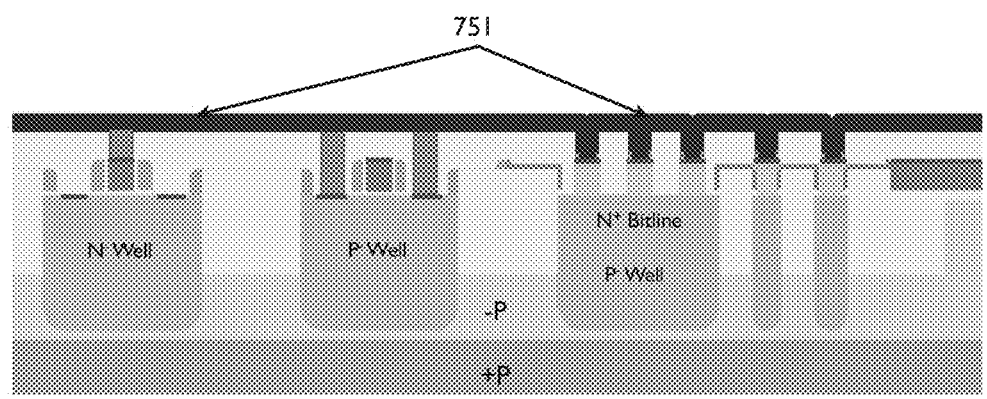

FIG. 75 shows the substrate in cross section following sputter deposition or MOCVD deposition of a phase-change material 751 such as a Chalcogenide alloy such as GST. (i.e., an alloy of elements including Germanium, Tellurium and Antimony). The Chalcogenide alloy thickness must be at least half of the diameter of the contact hole.

Figure 76:
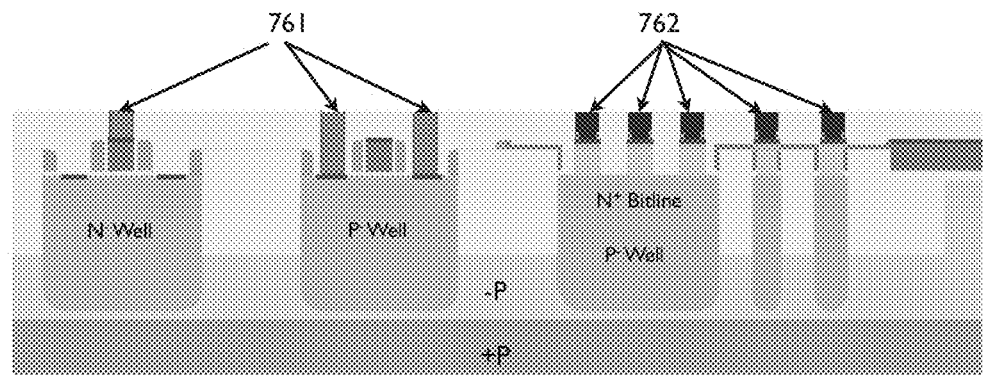

FIG. 76 shows the substrate in cross section following the planarization of the Chalcogenide alloy. CMP is used to remove the surface Chalcogenide alloy. The resulting surface will have contact points of tungsten (at the device contacts) and GST (at the information storage elements 0.

Figure 77:
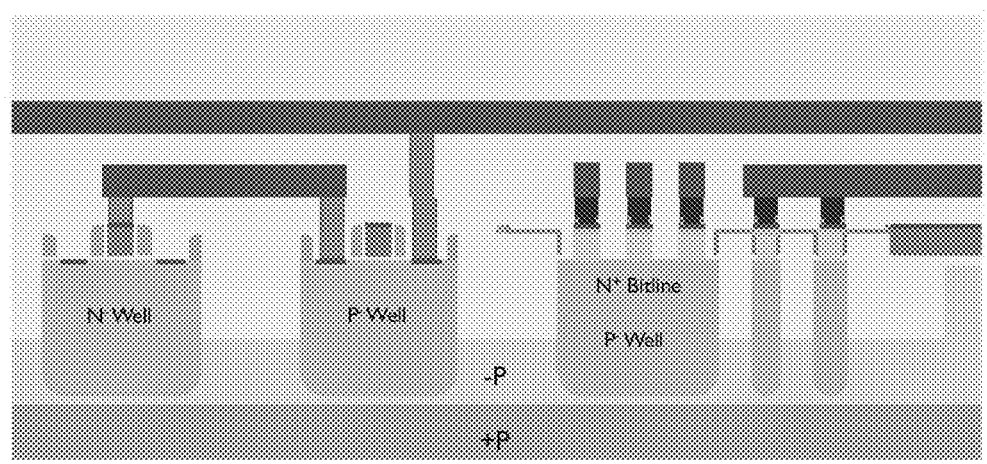
FIG. 77 illustrates a semiconductor substrate, following a the application of multiple metal layer steps, the result being depicted in cross-section.

Only the interconnect wiring of the metal layers remains to be done. This is done the same as is done in a standard CMOS process. FIG. 77 shows the substrate in cross section following two back end of line (BEOL) metal layers of interconnects. The present example figures also presumes that the source and drain contacts to the PMOS transistor and the gate contact to the NMOS transistor are formed in a plane other than that plane of the cross-section of the figures and are therefore not depicted. The interconnect would be followed by the formation of the bond pads and passivation. All of this, as well as the specifics of the many individual process steps described above, are all well understood by those skilled in the art. However, a key aspect of the present invention is the ordering of the steps such that the transistors and the diodes are formed with salicided contacts while the phase-change material is not subjected to high (above 800° C.) temperatures.

Devices constructed according to the present invention can be incorporated into memory card controller chips so as to combine the functions of the controller with the information storage circuitry in a single chip. Devices so constructed will find applicability in such areas as memory devices for storing digital text, digital books, digital music, digital audio, digital photography (wherein one or more digital still images can be stored including sequences of digital images), digital video, and digital cartography (wherein one or more digital maps can be stored), as well as any combinations thereof. These devices can be removable or removable and interchangeable among electronic systems that use memory cards. They can be packaged in any variety of industry standard form factors including Compact Flash, Secure Digital, MultiMedia Cards, PCMCIA Cards, Memory Stick, any of a large variety of integrated circuit packages including Ball Grid Arrays, Dual In-Line Packages (DIP's), SOIC's, PLCC, TQFP's and the like, as well as in custom designed packages. These packages can contain just the combined controller with memory chip, multiple memory chips, one or more memory chips along with other logic devices or other storage devices such as PLD's, PLA's, micro-controllers, microprocessors or chipsets or other custom or standard circuitry.

The foregoing description of an example of the preferred embodiment of the invention and the variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description, but rather by any claims appended hereto.

We claim:

1. A method of fabricating a CMOS logic device incorporating diode-based memory, the method comprising:
    forming a layer of gate insulator material over at least a first region of a substrate;
    forming a layer of gate electrode material over the gate insulator layer;
    over a second region of the substrate, forming a plurality of hollow cups;
    after the gate electrode material is formed, forming a memory diode material within the cups;
    selectively removing portions of the gate electrode material in the first region to define transistor gate electrodes, source electrodes, and drain electrodes;
    depositing a metal over at least some of the gate electrodes, source electrodes, and/or drain electrodes; and
    after the memory diode material is formed within the cups, annealing the metal to form silicide transistor contacts.

2. The method of claim 1, wherein the memory diode material comprises epi-silicon.

3. The method of claim 1, wherein the memory diode material comprises poly-silicon.

4. The method of claim 1, further comprising forming an information-storage material over the memory diode material.

5. The method of claim 4, wherein the information-storage material comprises a phase-change material.

6. The method of claim 5, wherein the phase-change material comprises a chalcogenide material.

7. The method of claim 5, wherein the phase-change material comprises at least one of germanium, tellurium, or antimony.

8. The method of claim 1, further comprising doping the memory diode material via ion implantation.

9. The method of claim 1, further comprising disposing the CMOS logic device within a package.

10. The method of claim 9, wherein the package is removable from and interchangeable among a plurality of electronic systems.

* * * * *

UNITED STATES PATENT AND TRADEMARK OFFICE
CERTIFICATE OF CORRECTION

| | |
|---|---|
| PATENT NO. | : 9,054,031 B2 |
| APPLICATION NO. | : 14/306801 |
| DATED | : June 9, 2015 |
| INVENTOR(S) | : Shepard et al. |

It is certified that error appears in the above-identified patent and that said Letters Patent is hereby corrected as shown below:

Specification

Column 2, Line 6, please delete "a" after following;

Column 2, Line 15, please delete "On" and insert --One-- therefor;

Column 4, Line 26, please delete "removed";

Column 9, Line 21, please delete "0" and insert --0)-- therefor.

Signed and Sealed this
First Day of December, 2015

Michelle K. Lee
*Director of the United States Patent and Trademark Office*